(12) United States Patent
Uematsu et al.

(10) Patent No.: US 8,545,296 B2
(45) Date of Patent: Oct. 1, 2013

(54) CLEAN ROOM

(75) Inventors: Katsuhito Uematsu, Osaka (JP); Naoko Matsuda, Osaka (JP); Hiroyuki Naka, Osaka (JP)

(73) Assignee: Panasonic Corporation, Osaka (JP)

( * ) Notice: Subject to any disclaimer, the term of this patent is extended or adjusted under 35 U.S.C. 154(b) by 1065 days.

(21) Appl. No.: 12/529,399

(22) PCT Filed: Oct. 20, 2008

(86) PCT No.: PCT/JP2008/002966
§ 371 (c)(1),
(2), (4) Date: Sep. 1, 2009

(87) PCT Pub. No.: WO2009/054116
PCT Pub. Date: Apr. 30, 2009

(65) Prior Publication Data
US 2010/0022179 A1 Jan. 28, 2010

(30) Foreign Application Priority Data
Oct. 26, 2007 (JP) .................................. 2007-278669

(51) Int. Cl.
*B01L 1/04* (2006.01)
(52) U.S. Cl.
USPC ....................................................... 454/187
(58) Field of Classification Search
USPC ....................................................... 454/187
See application file for complete search history.

(56) References Cited

U.S. PATENT DOCUMENTS

| | | | | |
|---|---|---|---|---|
| 3,513,766 A | * | 5/1970 | Ahlrich | 126/299 D |
| 4,838,150 A | * | 6/1989 | Suzuki et al. | 454/187 |
| 5,015,425 A | * | 5/1991 | Mimata et al. | 264/39 |
| 5,063,834 A | * | 11/1991 | Aalto et al. | 454/56 |
| 6,247,599 B1 | * | 6/2001 | Cheng et al. | 206/723 |

FOREIGN PATENT DOCUMENTS

| | | | | |
|---|---|---|---|---|
| JP | 61116233 A | * | 6/1986 | |
| JP | 62202949 A | * | 9/1987 | |
| JP | 04158138 A | * | 6/1992 | |
| JP | 7-012380 | | 1/1995 | |
| JP | 8-247512 | | 9/1996 | |

(Continued)

OTHER PUBLICATIONS

English translation of International Preliminary Report on Patentability and Written Opinion of the International Searching Authority, issued Jun. 1, 2010, in PCT/JP2008/002966.

(Continued)

*Primary Examiner* — Steven B McAllister
*Assistant Examiner* — Jamil Decker
(74) *Attorney, Agent, or Firm* — Wenderoth, Lind & Ponack, L.L.P.

(57) ABSTRACT

A dust-exhaust acceleration face of a dust-exhaust assistant member is disposed so as to face a top face of a heat radiating member of a production facility or the like so that a gap between the top face of the heat radiating member and the dust-exhaust acceleration face of the dust-exhaust assistant member is occupied by ascending air flows, each having a falling velocity (terminal velocity) that is not accelerated beyond a fixed velocity, to form a balanced state between the size of an object, such as a dust particulate or a chemical substance particulate, and air resistance when the object is freely falling in the air; thus, the object, such as a dust particulate and a chemical substance particulate, is prevented from falling onto the heat radiating member.

21 Claims, 30 Drawing Sheets

(56) References Cited

FOREIGN PATENT DOCUMENTS

| JP | 8-247513 | 9/1996 |
|----|----------|--------|
| JP | 2003-214668 | 7/2003 |
| JP | 2006-162090 | 6/2006 |

OTHER PUBLICATIONS

International Search Report issued Jan. 13, 2009 in International (PCT) Application No. PCT/JP2008/002966, filed Oct. 20, 2008.

* cited by examiner

Fig.6

| | MACHINE-INSPECTION AREA (pieces/30 minutes) | MAINTENANCE AREA (pieces/30 minutes) |
|---|---|---|
| PRIOR TO INSTALLATION | 4 | 122 |
| WORKING EXAMPLE 1 | 1 | 99 |
| WORKING EXAMPLE 2 | 2 | 105 |
| WORKING EXAMPLE 3 | 2 | 110 |

NUMBER OF DUST PIECES OF DUST COUNTER ATTACHED TO HEAT RADIATING MEMBER

Fig.8

| DISTANCE BETWEEN HEAT RADIATING MEMBER AND DUST-EXHAUST ACCELERATION FACE (mm) | TEMPERATURE DIFFERENCE BETWEEN SURFACE TEMPERATURE OF HEAT RADIATING MEMBER AND AMBIENT TEMPERATURE OF CLEAN CHAMBER (°C) | | |
|---|---|---|---|
| | 0~50 | 50~75 | 75~100 |
| $D_1$= 200~1000 | 3.5 | -1.1 | -3.5 |
| $D_2$= 1000~1500 | 1.1 | 3.2 | 2.1 |
| $D_3$= 1500~2000 | -1.5 | 0.9 | 3.9 |

MINIMUM VELOCITY IN VERTICAL DIRECTION OF AIR FLOW GENERATED BETWEEN HEAT RADIATING MEMBER AND DUST-EXHAUST ACCELERATION FACE (mm/s)

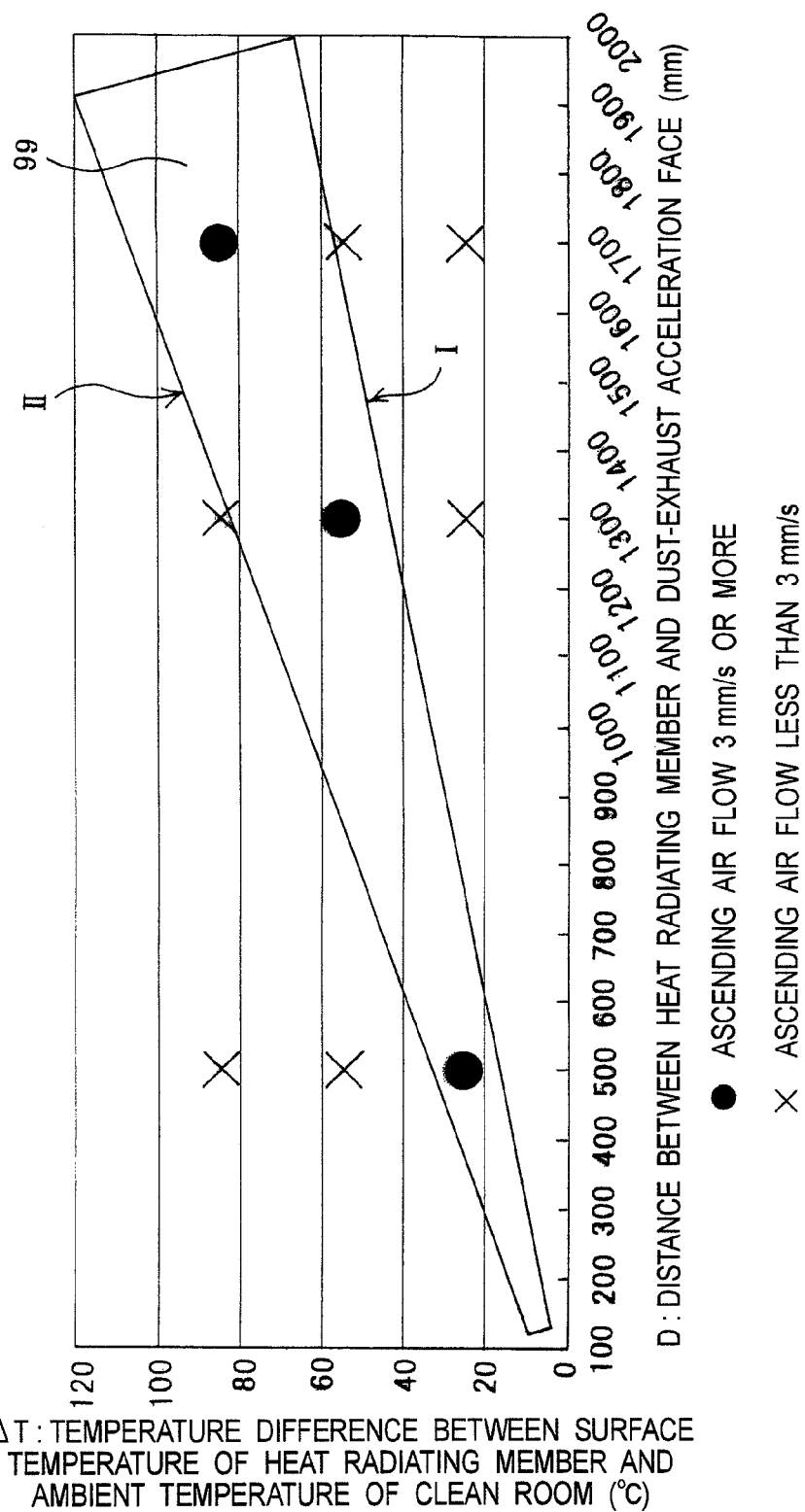

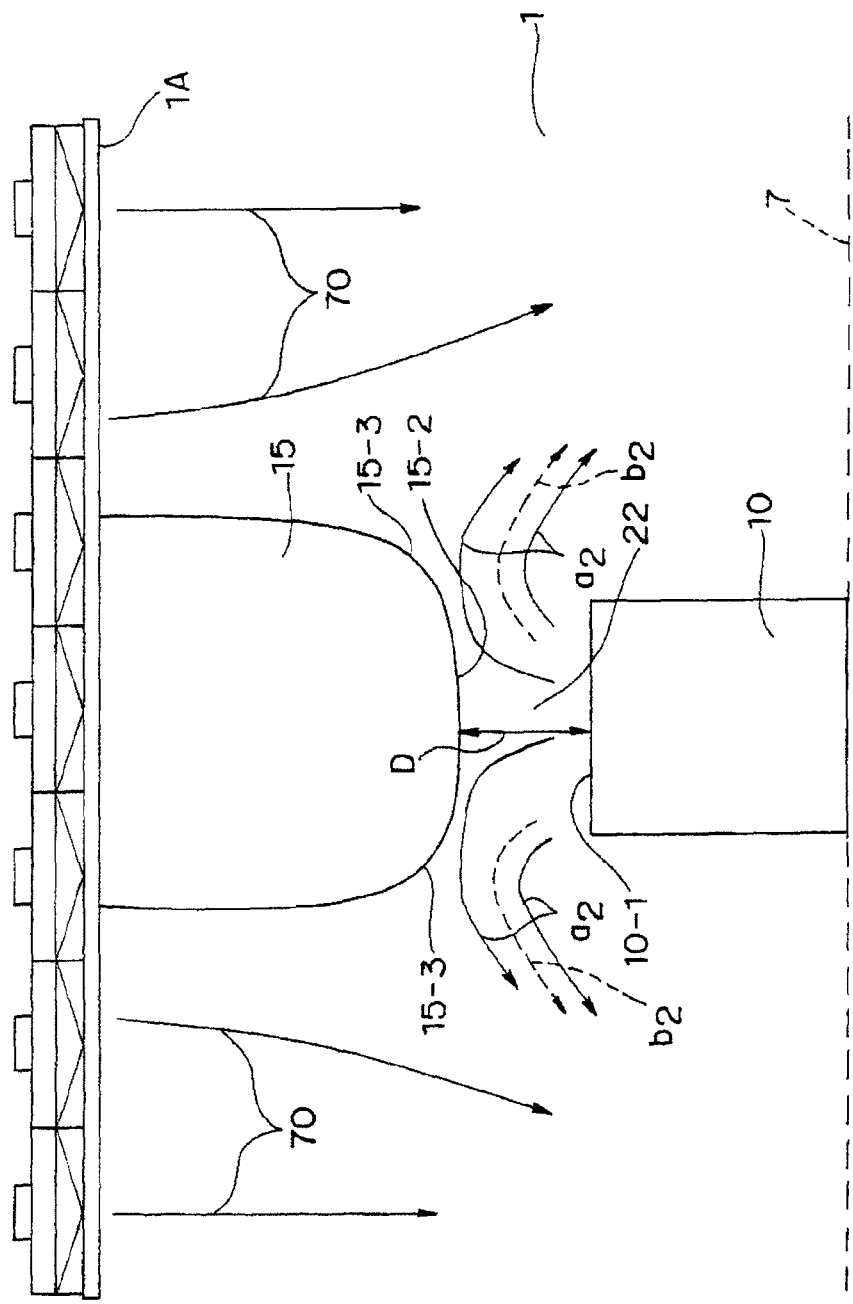

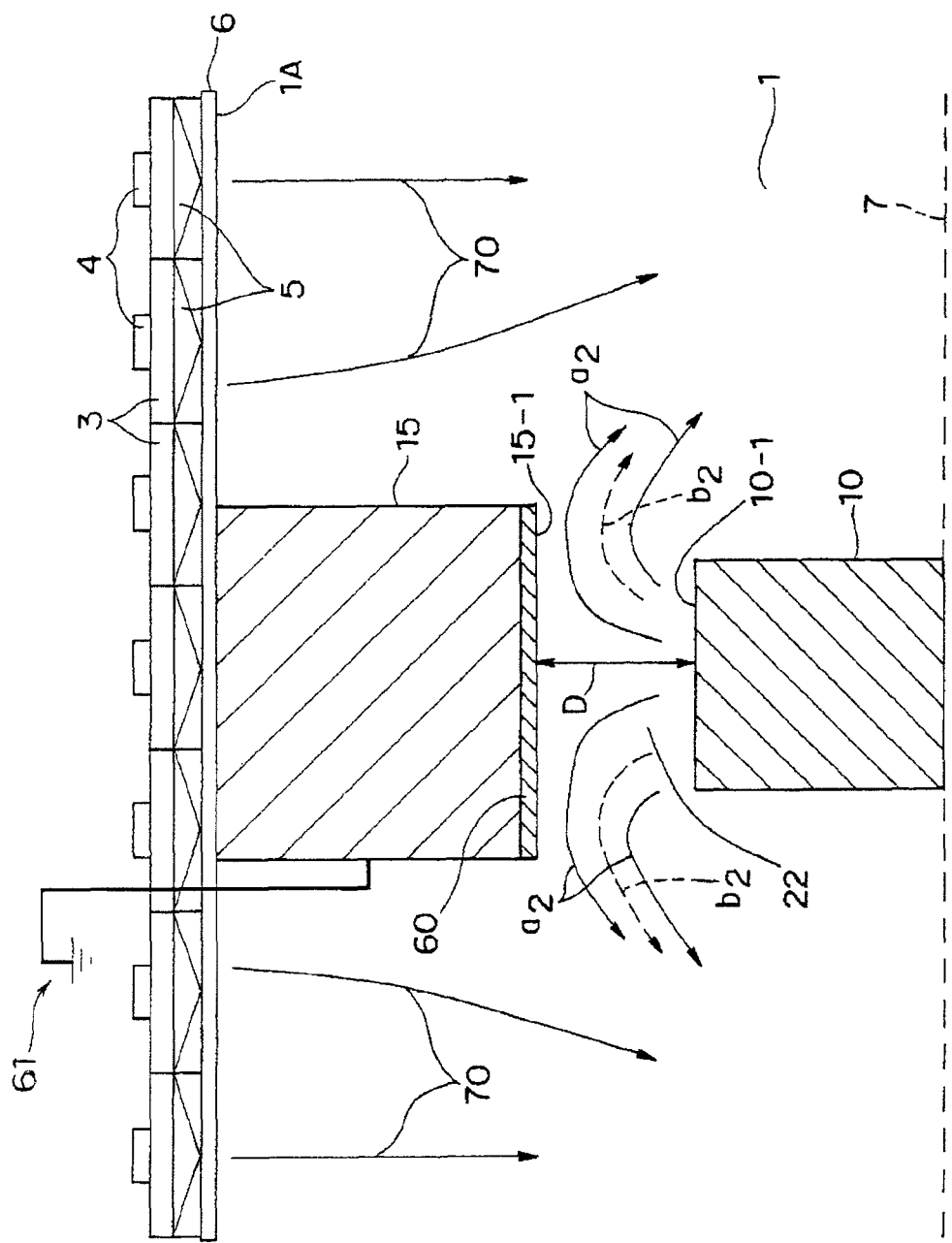

ly to be produced. The present invention has been made in view of the above-mentioned conditions, and its object is to provide a clean room that can achieve the above object with a simple configuration and that can keep a high cleanliness factor.

CLEAN ROOM

TECHNICAL FIELD

The present invention relates to a clean room that is used for a non-dust room or a sterile room in a semiconductor manufacturing factory, a FPD (Flat Panel Display) manufacturing factory, a precision machine factory, a chemicals manufacturing factory, and the like.

BACKGROUND ART

In a semiconductor factory or a FPD manufacturing factory, along with the developments of highly integrated devices, there have been strong demands for controlling environmental conditions, such as a cleanliness factor or temperature and moisture degrees, in high levels. Moreover, because of recent severe cost competitions in semiconductors or FPDs, there have been demands for reducing the construction cost of a clean room, that is, initial costs, and running costs of the clean room itself.

A full-face down flowing system, as shown in FIG. 29, has been proposed as a system for achieving a clean room having a high cleanliness factor. In this system, the air inside a ceiling chamber 102 is allowed to flow into a fan filter unit 103 from an air intake 104 of the fan filter unit 103 placed on a ceiling of a clean chamber 101, and is pressurized by a blower 105 placed inside the fan filter unit 103, and after dust has been removed by a high efficiency filter 106, clean air is allowed to flow into the clean chamber 101 vertically downward at a flow rate of, for example, about 0.25 to 0.5 m/s. Next, the air is allowed to flow into an under floor chamber 108 through a grating floor 107 of the clean chamber 101, and is returned to a ceiling chamber 102 through a return flow passage 109; thus, a circulating flow with such a structure is formed. With this circulating flow, since the same air has dust removed therefrom by the high efficiency filter 106 many times, the inside of the clean chamber 101 is maintained with a high cleanliness factor, after a lapse of predetermined time from the start of the operation of the clean room.

Moreover, heat radiating members 110, such as various IC manufacturing devices or various kinds of inspection devices, are installed on a grating floor 107 inside the clean chamber 101. Since the heat radiating members 110 sometimes use a toxic gas or the like, the air inside the clean chamber 101 is sucked into an exhaust guide flow passage 111 together with the toxic gas that has been properly treated, and is discharged out of the clean room through the exhaust guide flow passage 111 inside the under floor chamber 108 for the sake of safety. In order to control the pressure inside the clean chamber 101 to a predetermined value, air having virtually the same flow rate as the exhaust flow rate outward from the clean room is transported to the inside of the ceiling chamber 102 through a supply-air guide flow passage 112, and is supplied to the inside of the ceiling chamber 102 as supply air from a supply-air inlet placed in the supply-air guide flow passage 112. An external adjusting device 113, which adjusts outer air into air suitable for the clean room is installed in the supply-air guide flow passage 112.

Here, in the clean chamber 101, heat radiating members 110, such as IC manufacturing devices or various kinds of inspective devices, are installed, and depending on the kinds of the heat radiating members 110, the surface temperatures of some of these heat radiating members 110 tend to become about 25 degrees to about 100 degrees to cause considerable heat generation (for example, drying furnaces and the like) and to form heat generating sources in the clean chamber 101.

Conventionally, waste heat, generated by these heat radiating members 110 (thermal sources) is naturally diffused in the clean room, and the entire clean chamber 101 has been temperature-adjusted. Here, the clean rooms to be used for IC manufacturing rooms, various kinds of inspection rooms or the like, of course, need a high cleanliness factor with respect to dust, fine particulates, and the like, and these also need to be always maintained in a predetermined range, with respect to moisture and temperature.

The circulating flow of the clean chamber 101 is warmed by thermal loads of the heat radiating members 110 inside the clean chamber 101 or auxiliary devices, such as pumps (not shown), installed inside the under floor chamber 108; therefore, the temperature of the circulating flow that is directed into the under floor chamber 108 through the grating floor 107 of the clean chamber 101 becomes slightly higher than the ambient temperature of the clean chamber 101. In order to return this to a predetermined temperature, an air-conditioning device 104 is controlled so that the temperature inside the clean chamber 101 is kept constant.

As described above, in order to maintain the clean room environment, the clean room is provided with an air purifying device, such as the fan filter unit 103, having the high efficiency filter 106, and an air-conditioning device 114 that can control the temperature of air.

In such a conventional clean room, since a clean air flow is supplied to the clean chamber 101 at a uniform flow rate from the high efficiency filter 106 toward an under floor space 108, as shown in FIG. 30, the clean air flow is disturbed on the upper side of the heat radiating members 110, such as production facilities, as indicated by arrows "a" of solid lines in FIG. 30 by ascending air flows caused by heat generation or heat radiating from the heat radiating members 110 such as production facilities, with the result that pollutants, such as dust and chemical substances, generated on the upper portions of the heat radiating members 110 or the periphery thereof, tend to drop on the heat radiating members 110 as indicated by arrows "b" of dotted lines, resulting in adverse effects to the clean environment.

As a method for protecting the clean environment of the clean chamber 101 from pollutants, such as dust and chemical substances, a diffusion preventive method has been proposed (for example, see Patent Document 1) in which an air suction means (not shown) for sucking air containing pollutants such as dust and chemical substances on the upper portion of the heat radiating member 110 is disposed on the filter unit 103 on the upper side of the heat radiating member 110 so that the air containing pollutants such as dust and chemical substances on the upper side of the heat radiating member 110 is sucked from the filter unit 103 located on the upper side of the heat radiating member 110, and the pollutants such as dust and chemical substances are consequently captured by the high efficiency filter 106, and prevented from being diffused to the clean chamber 101.

Patent Document 1: JP-A No. 8-247512

However, in an attempt to suck air containing pollutants, such as dust and chemical substances, through the filter unit 103 on the upper side of the heat radiating member 110, although air located close to the filter unit 103 can be sucked sufficiently, air close to the upper portion of the heat radiating member 110 is located at a position far from the filter unit 103, with the result that the suction force becomes insufficient on the air close to the upper portion of the heat radiating member 110, failing to sufficiently suck the air located close to the upper portion of the heat radiating member 110.

As a result, air that contains pollutants, such as dust and chemical substances, on the upper portion of the heat radiating member 110, tends to drift on the upper side of the heat radiating member 110 for a long period of time, due to whirling air flows, thermal convections, or the like generated on the upper portion of the heat radiating member 110. Consequently, the concentration of dust, chemical substances, or the like in the air increases, with the result that gigantic size or weight increases due to collision among dust, chemical substances, or the like cause the dust or chemical substances or the like to freely fall down finally to adhere onto a wafer manufactured in the heat radiating member 110, failing to satisfy necessary quality required for the wafer or sufficient productivity thereof.

At present, the wiring pattern pitch on the wafer is about 50 nanometers, which corresponds to an ultra fine structure, and when pollutants such as dust or chemical substances having a size larger than the wiring pattern pitch fall on the wafer, the wafer tends to be short-circuited by the pollutants, such as dust or chemical substances, to cause an abnormal heat generation or burning.

SUMMARY OF THE INVENTION

In view of the above-mentioned issues with the prior art, the present invention has been devised, and the object thereof is to provide a clean room that can suppress dust and chemical substances from adhering onto a wafer or the like by optimizing air flows caused by whirling air flows or thermal convections generated on an upper portion of each of heat radiating members, such as various IC manufacturing devices or various kinds of inspection devices.

In order to achieve the above-mentioned object, the present invention adopts the following:

First, the present inventors have considered that the reasons for the conventional issues lie in that, without completely taking ascending air flows generated by heat of the heat radiating member 110 on the upper side of the heat radiating member 110 into consideration, or by installing an air suction means for sucking air containing pollutants in a completely separated manner from the ascending air flows, an air suction process is forcefully carried out, and have tried to utilize the ascending air flows generated by heat of the heat radiating member 110 without the necessity of artificially forming such a forceful flow of a fluid.

Here, in general, it has been known as Stokes's law shown in FIG. 2 that there is a relationship between the size of an object, such as a dust particulate or a chemical substance particulate, and a falling velocity (terminal velocity) thereof that is not accelerated beyond a fixed velocity, derived from a balanced state between the object and air resistance, when the object is freely falling in the air. That is, when a flow is raised toward the object, such as a dust particulate or a chemical substance particulate, from below at a velocity higher than the terminal velocity, the object is prevented from falling down.

Moreover, due to a temperature difference between the surface temperature of a heat radiating member such as a production facility and the ambient temperature of a clean chamber, an ascending air flow is generated above a top face of the heat radiating member, and for example, in a case where the surface temperature of a top face of the heat radiating member is 50° C., at a position close to the top face, that is, about 10 cm to 30 cm apart from the top face of the heat radiating member, a comparatively fast ascending air flow is always present; however, at a position about 100 cm apart from the top face, the ascending air flow is very weak. In this manner, it has been known that there is a fixed relationship between the temperature difference between the surface temperature of the top face of the heat radiating member such as a production facility and the ambient temperature of the clean chamber, and an ascending air flow velocity at a fixed distance from the top face of the heat radiating member such as a production facility.

As described above, in a case where the distribution of ascending air flows having a velocity faster than a falling velocity (terminal velocity) that is determined by the size of an object such as a dust particulate or a chemical substance particulate always occupies a space above the top face of the heat radiating member such as a production facility, pollutants, such as dust and chemical substances, are prevented from falling on the top face of the heat radiating member, that is, on a wafer produced by the production facility corresponding to the heat radiating member.

By paying attention to this point, the present inventors have preliminarily calculated and analyzed the terminal velocity that does not allow free falling based upon the size of the object such as dust, chemical substances, or the like, and have developed a structure in which, in addition to these, the distribution of the ascending air flow is also taken into consideration based upon the temperature difference between the surface temperature of the top face of the heat radiating member such as a production facility and the ambient temperature of the clean chamber.

In order to achieve the above-mentioned object, the present invention is provided with the following structures.

According to a first aspect of the present invention, there is provided a clean room comprising:

a dust-exhaust assistant member that has a dust-exhaust acceleration face for facing a top face of a heat radiating member placed on a floor and that allows the dust-exhaust acceleration face to be positioned such that a distance is defined between the dust-exhaust acceleration face and the top face of the heat radiating member so that an ascending air flow rising from the top face of the heat radiating member caused by heat generation of the heat radiating member is discharged outward from a gap between the dust-exhaust acceleration face and the top face of the heat radiating member by the dust-exhaust acceleration face.

According to a second aspect of the present invention, there is provided the clean room according to the first aspect, further comprising:

a supporting member for supporting the dust-exhaust assistant member, wherein the supporting member laterally extends above the heat radiating member from a side wall that is orthogonal to the floor so as to support the dust-exhaust assistant member.

According to a third aspect of the present invention, there is provided the clean room according to the first aspect, further comprising:

a supporting member for supporting the dust-exhaust assistant member, wherein the supporting member extends upward from the floor to support the dust-exhaust assistant member.

According to a fourth aspect of the present invention, there is provided the clean room according to the first aspect, further comprising:

a supporting member for supporting the dust-exhaust assistant member, wherein the supporting member extends upward from the heat radiating member to support the dust-exhaust assistant member.

According to a fifth aspect of the present invention, there is provided the clean room according to the first aspect, further comprising:

a supporting member for supporting the dust-exhaust assistant member, wherein the supporting member extends above the heat radiating member from a device adjacent to the heat radiating member to support the dust-exhaust assistant member.

According to a sixth aspect of the present invention, there is provided the clean room according to the first aspect, further comprising:

a supporting member for supporting the dust-exhaust assistant member, wherein the supporting member supports the dust-exhaust assistant member from a ceiling that faces the floor.

According to a seventh aspect of the present invention, there is provided the clean room according to any one of the first to sixth aspects, wherein a value K (° C./mm), obtained by dividing a temperature difference between a surface temperature of the top face of the heat radiating member and a temperature of a peripheral atmosphere by a distance between the top face of the heat radiating member and the dust-exhaust acceleration face of the dust-exhaust assistant member, is allowed to maintain a relationship $0.032 \leq K \leq 0.065$.

According to an eighth aspect of the present invention, there is provided the clean room according to any one of the first to sixth aspects, further comprising:

a first heat radiating member and a second heat radiating member having higher temperature than the first heat radiating member being placed on the floor as the heat radiating member, with a temperature difference between a surface temperature of a top face of the first heat radiating member and a temperature of a peripheral atmosphere of the first heat radiating member being larger than a temperature difference between a surface temperature of a top face of the second heat radiating member and a temperature of a peripheral atmosphere of the second heat radiating member; and a first dust-exhaust assistant member that has a dust-exhaust acceleration face facing the top face of the first heat radiating member, and is disposed so as to protrude downward from a ceiling facing the clean room, and a second dust-exhaust assistant member that has a dust-exhaust acceleration face facing the top face of the second heat radiating member, and is disposed so as to protrude downward from the ceiling facing the clean room, which serve as the dust-exhaust assistant member, wherein a first distance between the top face of the first heat radiating member and the dust-exhaust acceleration face of the first dust-exhaust assistant member is made larger than a second distance between the top face of the second heat radiating member and the dust-exhaust acceleration face of the second dust-exhaust assistant member.

These arrangements make it possible to prevent dust, chemical substances, and the like from falling on a heat radiating member, and consequently to suppress the dust, chemical substances, and the like from adhering onto a wafer that is a subject to be processed in, for example, a semiconductor manufacturing device serving as one example of the heat radiating member.

According to a ninth aspect of the present invention, there is provided the clean room according to any one of the first to sixth aspects, wherein the dust-exhaust acceleration face of the dust-exhaust assistant member has an anti-static layer.

According to a 10th aspect of the present invention, there is provided the clean room according to any one of the first to sixth aspects, wherein the dust-exhaust acceleration face of the dust-exhaust assistant member is grounded.

These arrangements make pollutants, such as dust and chemical substances, hardly adhere to the dust-exhaust assistant member, and consequently prevent the pollutants, such as dust and chemical substances, from falling on the heat radiating member more effectively.

According to an 11th aspect of the present invention, there is provided the clean room according to any one of the first to sixth aspects, wherein the dust-exhaust assistant member is made of a box or an air packing.

According to a 12th aspect of the present invention, there is provided the clean room according to the 11th aspect, wherein the dust-exhaust assistant member is made of an air packing that is disposed so as to allow the dust-exhaust assistant member to shift upward and downward relative to the ceiling by an ascending air flow from the heat radiating member.

These arrangements make it possible to eliminate the necessity of carrying out a large-scale construction work on a ceiling face, and also to install the dust-exhaust assistant member on the ceiling without the necessity of stopping the production activities; thus, it becomes possible to promote cost reduction, and also to control the production conditions and environmental conditions, such as the cleanliness factor or temperature/moisture degrees, to higher levels.

According to a 13th aspect of the present invention, there is provided the clean room according to any one of the first to sixth aspects, wherein the dust-exhaust acceleration face of the dust-exhaust assistant member is disposed so as to cover virtually the entire top face of the heat radiating member.

As described above, in the clean room of the present invention, an ascending air flow rising from the top face of the heat radiating member due to heat generation of the heat radiating member is guided to flow outward from the gap between the dust-exhaust acceleration face of the dust-exhaust assistant member and the top face of the heat radiating member, by the dust-exhaust acceleration face of the dust-exhaust assistant member. Consequently, pollutants, such as dust and chemical substances, generated on the upper portion of the heat radiating member or on the periphery thereof, are discharged outward from the gap together with the ascending air flow, thereby making it possible to effectively prevent the pollutants from dropping onto the top face of the heat radiating member. That is, by optimizing ascending air flows caused by whirling air flows or thermal convections generated on the upper portion of each of the heat radiating members, such as various IC manufacturing devices or various kinds of inspection devices, it becomes possible to prevent pollutants, such as dust and chemical substances, from falling onto a wafer that is a subject to be processed in the heat radiating member, and adhering thereto.

Moreover, in a case where the dust-exhaust assistant member is made of a simple box or air packing, it is possible to eliminate the necessity of carrying out a large-scale construction work on the ceiling face, and also to install the dust-exhaust assistant member on the ceiling without the necessity of stopping the production activities; thus, it becomes possible to achieve low costs, and also to control the production conditions and environmental conditions, such as cleanliness factor or temperature/moisture degree, to higher levels.

BRIEF DESCRIPTION OF THE DRAWINGS

These and other aspects and features of the present invention will become clear from the following description taken in conjunction with the preferred embodiments thereof with reference to the accompanying drawings, in which:

FIG. 6 is a diagram that shows the results of number-counting measurements of the pollutant in working examples 1 to 3 of the clean room in accordance with the first embodiment of the present invention, and also indicates the amount of dust counted by a dust counter attached to the heat radiating member, in the form of a table;

FIG. 8 is a view that shows the results in the form of a table of the thermal fluid analyses shown in FIGS. 7A to 7C, in which the minimum velocity in the vertical direction of a gas flow generated between a top face of the heat radiating member and the dust-exhaust assistant member is summarized based upon three temperature ranges (0 to 50° C., 50 to 75° C., and 75 to 100° C.) between the surface temperature of the top face of the heat radiating member and the ambient temperature of the clean room, and three distance ranges (200 to 1000 mm, 1000 to 1500 mm, and 1500 to 2000 mm) among the top faces of three heat radiating members and the dust-exhaust acceleration faces of three dust-exhaust assistant members;

FIG. 9 is a graph that shows a relationship between a temperature difference between the surface temperature of the top face of the heat radiating member and the ambient temperature of the clean room and the distance between the top face of the heat radiating member and the dust-exhaust acceleration face of the dust-exhaust assistant member, in a state in which, by arrangements given in working examples 1 to 3 of the clean room in accordance with the first embodiment of the present invention, pollutants, such as dust and chemical substances, are prevented from falling down on the top face of the heat radiating member, by allowing the gap between the top face of each of the heat radiating members and the dust-exhaust acceleration face of the dust-exhaust assistant member to be occupied by an ascending air flow having a velocity of 3 mm/s or more so as to allow the pollutant particulate to form a balanced state with air resistance during free fall, with its velocity being a falling velocity (terminal velocity) that is not accelerated beyond a fixed velocity;

FIG. 10 is a schematic explanatory view that shows a clean room relating to a modified example of the first embodiment of the present invention;

FIG. 11 is a schematic explanatory view that shows a clean room relating to another modified example of the first embodiment of the present invention;

DETAILED DESCRIPTION OF THE INVENTION

Figure 1:
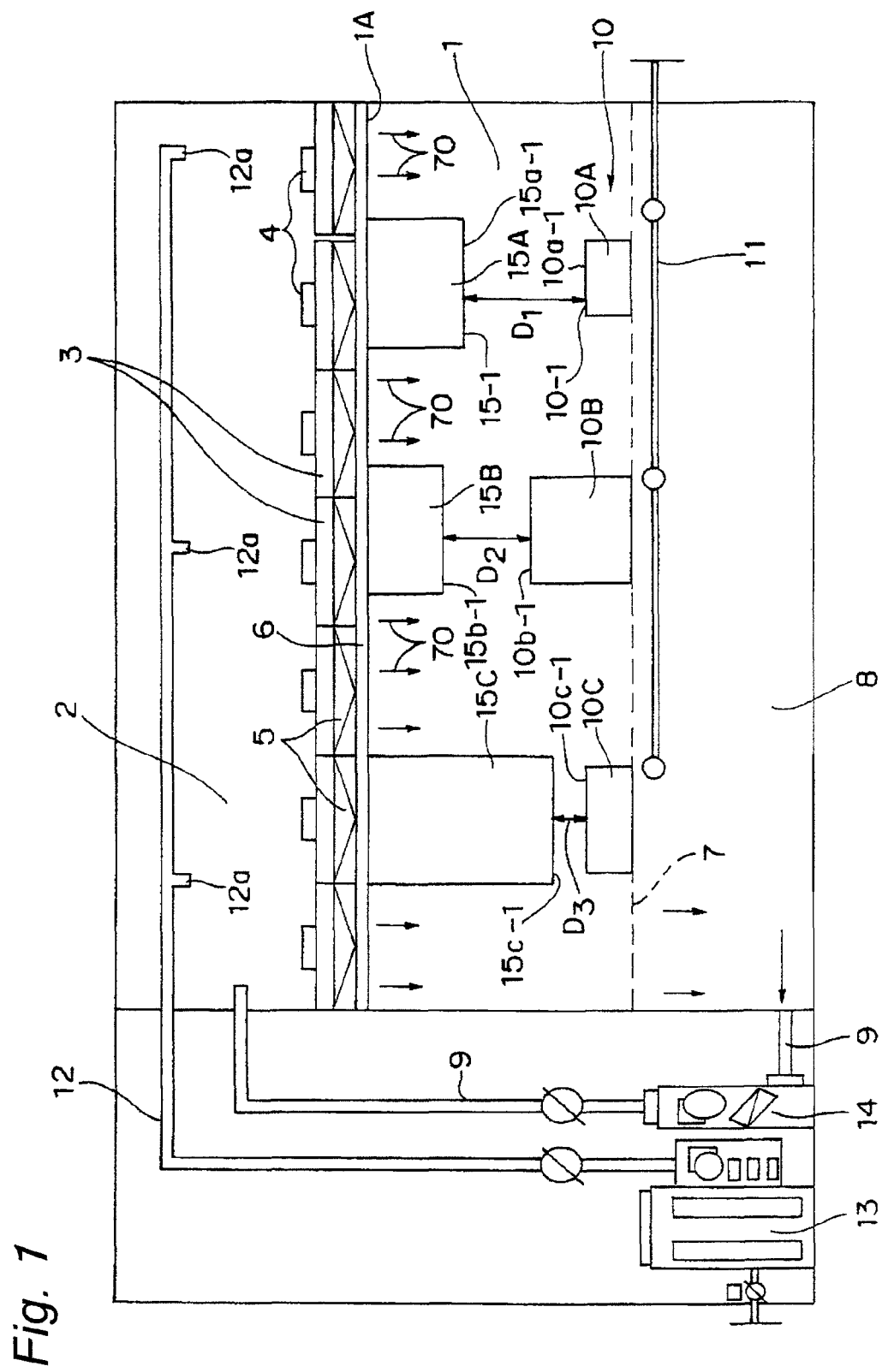
FIG. 1 is a schematic explanatory view that shows a clean chamber of a clean room in accordance with a first embodiment of the present invention in which heat radiating members are placed.

Before the description of the present invention proceeds, it is to be noted that like parts are designated by like reference numerals throughout the accompanying drawings.

Referring to Figures, the following description will discuss embodiments relating to the present invention in detail.

Referring to Figures, the following description will discuss a first embodiment of the present invention in detail.

Referring to FIG. 1, the following description will discuss the outline of a clean room in accordance with the first embodiment of the present invention. This clean room has a structure in which, in order to maintain the cleanliness factor of a clean chamber 1 in a high level to a certain degree, air inside the clean chamber 1 is discharged out of the clean chamber 1, and after the discharged air has been adjusted to predetermined air conditions, the air is, for example, circulated into the clean chamber so that the temperature, moisture, and cleanliness factor of the clean chamber 1 are adjusted. Here, as one example of a system for achieving such a clean room having a high cleanliness factor, the following description will exemplify a full-face down flow system as shown in FIG. 1.

In this system, air inside a ceiling chamber 2 above the clean chamber 1 is allowed to flow into a fan filter unit 3 from an air intake 4 of the fan filter unit 3 installed on a ceiling 1A of the clean chamber 1, and is pressurized by a blower placed inside the fan filter unit 3, and after dust thereof has been removed by a high efficiency filter 6, clean air is allowed to flow into the clean chamber 1 vertically downward at a flow rate of, for example, about 0.25 to 0.5 m/s.

Next, the clean air, flowed into the clean chamber 1 from the ceiling chamber 2 vertically downward, as indicated by an arrow 70, is allowed to flow into an under floor chamber 8 through a grating floor 7 of the clean chamber 1, and returned to the ceiling chamber 2 from the under floor chamber 8 through a return flow passage 9; thus, a circulating flow with such a structure is formed. Since the same air has dust removed therefrom by the high efficiency filter 6 many times by such a circulating flow, the inside of the clean chamber 1 is maintained in a high level in the cleanliness factor, after a lapse of predetermined time from the start of the operation of the clean room.

Moreover, in the clean chamber 1, a plurality of heat radiating members 10A, 10B, and 10C, such as various IC manufacturing devices or various kinds of inspection devices, are placed on the grating floor 7. Specific examples of the heat radiating sources of the heat radiating members 10A, 10B, and 10C include driving sources, such as motors in semiconductor manufacturing devices, such as IC manufacturing devices, or various inspection devices, and controlling units for controlling the driving sources or for respectively controlling the driving sources and image-processing units, as well as illumination devices for various kinds of inspection devices and the like. It is considered that heat radiated from these heat radiating sources is transmitted virtually uniformly to the entire portion of the respective devices so that the entire devices are heated uniformly to form the heat radiating members 10A, 10B, and 10C. Here, in order to simplify the drawings, the heat radiating members 10A, 10B, and 10C are illustrated as rectangular parallelepiped shapes. Depending on the kinds thereof, the surface temperatures of the top faces of some of these heat radiating members 10A, 10B, and 10C (the average temperature of the top faces thereof under continuous operations of the facilities in a case where the heat radiating members 10A, 10B, and 10C are facilities) tend to become near 100 degrees to cause a considerable heat generation (for example, a drying furnace), with the result that these tend to form heat generating sources in the clean chamber 1. Waste heat, released from these heat radiating members 10A, 10B, and 10C (heat sources), is, for example, naturally diffused in the clean room so that the entire clean chamber 1 is temperature-adjusted. Here, the clean rooms to be used for IC manufacturing rooms, various kinds of inspection rooms, or the like, of course, need a high cleanliness factor with respect to dust, fine particulates, and the like, and these also need to be always maintained in a predetermined range, with respect to moisture and temperature.

Moreover, since the heat radiating members 10A, 10B, and 10C sometimes use a toxic gas or the like, the air inside the clean chamber 1 is sucked into an exhaust guide flow passage 11 together with the toxic gas that has been properly treated for safety, and discharged out of the clean room by the exhaust guide flow passage 11 for the sake of safety. In order to control the pressure inside the clean chamber 1 to a predetermined value, air having virtually the same flow rate as the outward exhaust flow rate is transported to the inside of the ceiling chamber 2 by a supply-air guide flow passage 12, and supplied to the inside of the ceiling chamber 2 as supply air from a supply-air inlet 12a placed in the supply-air guide flow passage 12. An external adjusting device 13 for adjusting outer air into air suitable for the clean room, is installed in the middle of the supply-air guide flow passage 12.

The circulating flow of the clean chamber 1 is warmed by thermal loads of the heat radiating members 10A, 10B, and 10C inside the clean chamber 1 or auxiliary devices, such as pumps (not shown), installed inside the under floor chamber 8; therefore, the temperature of the circulating flow that has been directed into the under floor chamber 8 through the grating floor 7 of the clean chamber 1 becomes slightly higher than the ambient temperature of the clean chamber 1. In order to return this to a predetermined temperature, the temperature of clean air inside the return flow passage 9 is controlled by an air-conditioning device 14 installed in the middle of the return flow passage 9; thus, it becomes possible to keep the temperature inside the clean chamber 1 constant.

As described above, in order to maintain the clean room environment, the clean room is provided with an air purifying device, such as the fan filter unit 3, having the high efficiency filter 6, and the air-conditioning device 14 that can control the temperature of air.

Figure 3:
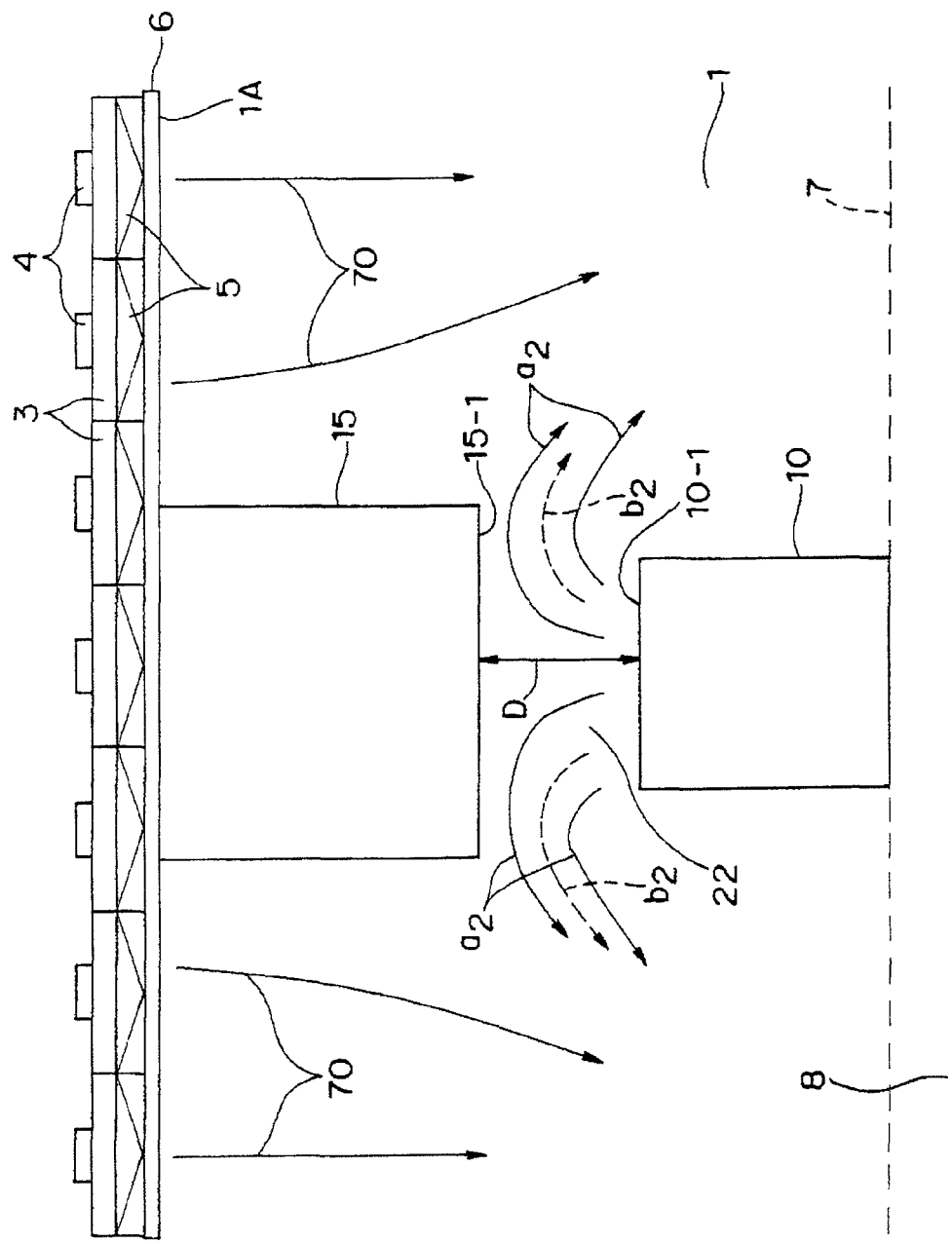
FIG. 3 is a schematic explanatory view that indicates ascending air flows from the heat radiating member and flows of the pollutant in the clean room in accordance with the first embodiment of the present invention.

In this clean room, dust-exhaust assistant members 15A, 15B, and 15C, which respectively have dust-exhaust acceleration faces 15-1 that face the respective top faces 10-1 of the heat radiating members 10A, 10B, and 10C placed inside the clean chamber 1 in the vertical direction, are, as one example, respectively disposed in a manner so as to protrude downward from a ceiling 1A facing the clean chamber 1. Here, the arrangement is made such that, as the temperature difference between the surface temperatures of the top faces 10-1 of the heat radiating members 10A, 10B, and 10C (the average temperature of the top faces thereof under continuous operations of the facilities in the case where the heat radiating members 10A, 10B, and 10C are facilities) and the ambient temperatures on the periphery of the heat radiating members 10A, 10B, and 10C becomes higher, distances D between the top faces 10-1 of the heat radiating members 10A, 10B, and 10C and the dust-exhaust acceleration faces 15-1 of the dust-exhaust assistant members 15A, 15B, and 15C are made larger. That is, as shown in FIG. 3, the dust-exhaust acceleration face 15-1 is positioned above the upper surface 10-1 of the heat radiating member 10, with the distance D being made wider, so as to allow an ascending air flow $a_2$ rising from each of the top faces 10-1 of the heat radiating member 10 due to the heat generation of the heat radiating member 10 to be positively accelerated and discharged from a gap 22 between the dust-exhaust acceleration face 15-1 of the dust-exhaust assistant member 15 and the top face 10-1 of the heat radiating member 10 outside the gap, by the dust-exhaust acceleration face 15-1 of the dust-exhaust assistant member 15.

Here, in a case where the heat radiating members need to be distinguished individually, by using reference numerals such as 10A, 10B, and 10C, the respective heat radiating members are distinguished, and in a case where these are generally referred to, each of these is indicated by reference numeral 10. In the same manner, in a case where the top faces 10-1 of the heat radiating members 10 need to be distinguished individually, by using reference numerals such as 10a-1, 10b-1, and 10c-1, the respective top faces 10-1 thereof are distinguished, and in a case where these are generally referred to, each of these is indicated by reference numeral 10-1. In the same manner, in a case where the dust-exhaust assistant members 15 need to be distinguished individually, by using reference numerals such as 15A, 15B, and 15C, the respective dust-exhaust assistant members 15 are distinguished, and in a case where these are generally referred to, each of these is indicated by reference numeral 15. In a case where the dust-exhaust acceleration faces 15-1 need to be distinguished individually, by using reference numerals such as 15a-1, 15b-1, and 15c-1, the respective dust-exhaust acceleration faces 15-1 are distinguished, and in a case where these are generally referred to, each of these is indicated by reference numeral 15-1.

Here, the following description will discuss the importance of the distance D between the top face 10-1 of the heat radiating member 10 and the dust-exhaust acceleration face 15-1 of the dust-exhaust assistant member 15. In the following FIGS. 3 to 5, it is defined that the same heat radiating member 10 is used, with only the distance D being changed, while the same dust-exhaust assistant member 15 is used, with the height from the ceiling 1A being changed (in other words, with the position of the dust-exhaust acceleration face 15-1 of the dust-exhaust assistant member 15 in the height direction (for example, the vertical direction) being changed).

Figure 4:
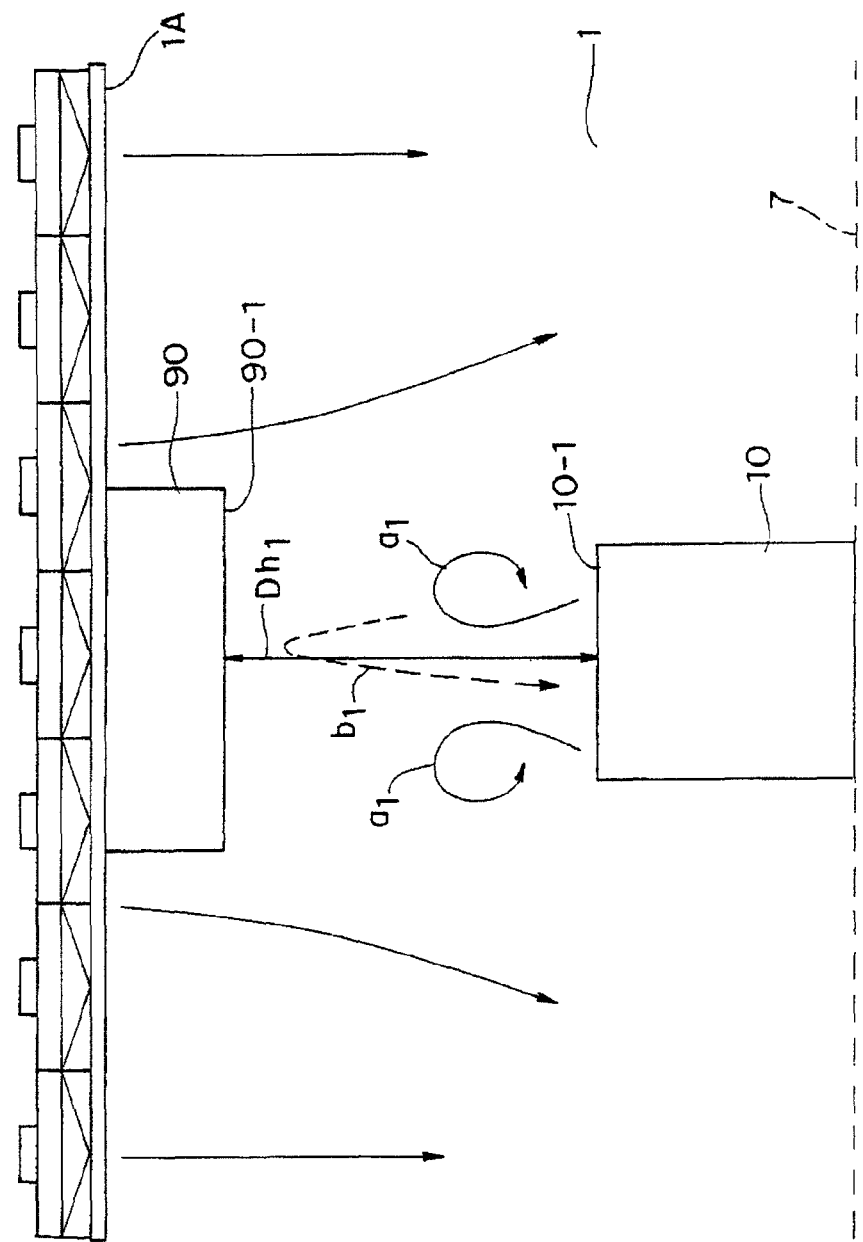
FIG. 4 is a schematic explanatory view that shows a clean room for use in comparison with the clean room of the first embodiment of the present invention, and explains ascending air flows from the heat radiating member and flows of the pollutant in a case where there is too long a distance between a top face of the heat radiating member and a dust-exhaust acceleration face of a dust-exhaust assistant member.

First, as shown in FIG. 4, suppose that a box 90 having a flat face 90-1 facing the top face 10-1 of the heat radiating member 10 placed inside the clean chamber 1 in the vertical direction is placed in a manner so as to protrude downward from the ceiling 1A that faces the clean chamber 1. Here, a distance $Dh_1$ between the top face 10-1 of the heat radiating member 10 and the flat face 90-1 of the box 90 is kept greatly separated from the distance D of the present invention. In this case, an ascending air flow rising from the top face 10-1 of the heat radiating member 10 due to heat generation of the heat radiating member 10 is not allowed to reach the flat face 90-1 of the box 90, and descends from the center side of the gap between the top face 10-1 of the heat radiating member 10 and the flat face 90-1 of the box 90 toward the peripheral portion thereof in a whirl, as indicated by an arrow $a_1$ of a solid line. As a result, pollutants, such as dust or chemical substances, generated on the upper portion of the heat radiating member 10 or on the periphery thereof, drop onto the top face 10-1 of the heat radiating member 10, as indicated by an arrow $b_1$ of a dotted line, giving adverse effects to the clean environment.

Next, as shown in FIG. 3, a dust-exhaust assistant member 15 having a dust-exhaust acceleration face 15-1 facing the top face 10-1 of the heat radiating member placed inside the clean chamber 1 in the vertical direction is placed in a manner so as to protrude downward from the ceiling 1A that faces the clean chamber 1. In this case, the dust-exhaust acceleration face 15-1 is positioned with such a distance D as to allow an ascending air flow rising from the top face 10-1 of the heat radiating member 10 due to heat generation of the heat radiating member 10 to be discharged from a gap 22 between the dust-exhaust acceleration face 15-1 of the dust-exhaust assistant member 15 and the top face 10-1 of the heat radiating member 10 outside of the gap, by the dust-exhaust acceleration face 15-1 of the dust-exhaust assistant member 15. In this case, an ascending air flow $a_2$ rising from the top face 10-1 of the heat radiating member 10 due to heat generation of the heat radiating member 10 is allowed to reach the dust-exhaust acceleration face 15-1, and to flow along the dust-exhaust acceleration face 15-1 to be discharged outward from the center side of the gap 22 between the dust-exhaust acceleration face 15-1 of the dust-exhaust assistant member 15 and the top face 10-1 of the heat radiating member 10. As a result, pollutants, such as dust and chemical substances, generated on the upper portion of the heat radiating member 10 or on the periphery thereof, are discharged outward from the center side of the gap 22 together with an ascending air flow indicated by an arrow $a_2$ of a solid line, as indicated by an arrow $b_2$ of a dotted line, so that the pollutants are prevented from dropping on the top face 10-1 of the heat radiating member 10, thereby preventing adverse effects from being given to the clean environment. Here, the pollutants, discharged outward from the center side of the gap 22 by the ascending air flow $a_2$, are allowed to flow into the under floor chamber 8 through the grating floor 7 together with the clean air supplied to the clean chamber 1 at a uniform flow rate from the high efficiency filter 6 toward the under floor chamber 8 (see arrow 70), and are returned to the ceiling chamber 2 from the under floor chamber 8 through the return flow passage 9 so that dust thereof is removed by the high efficiency filter 6.

Figure 5:
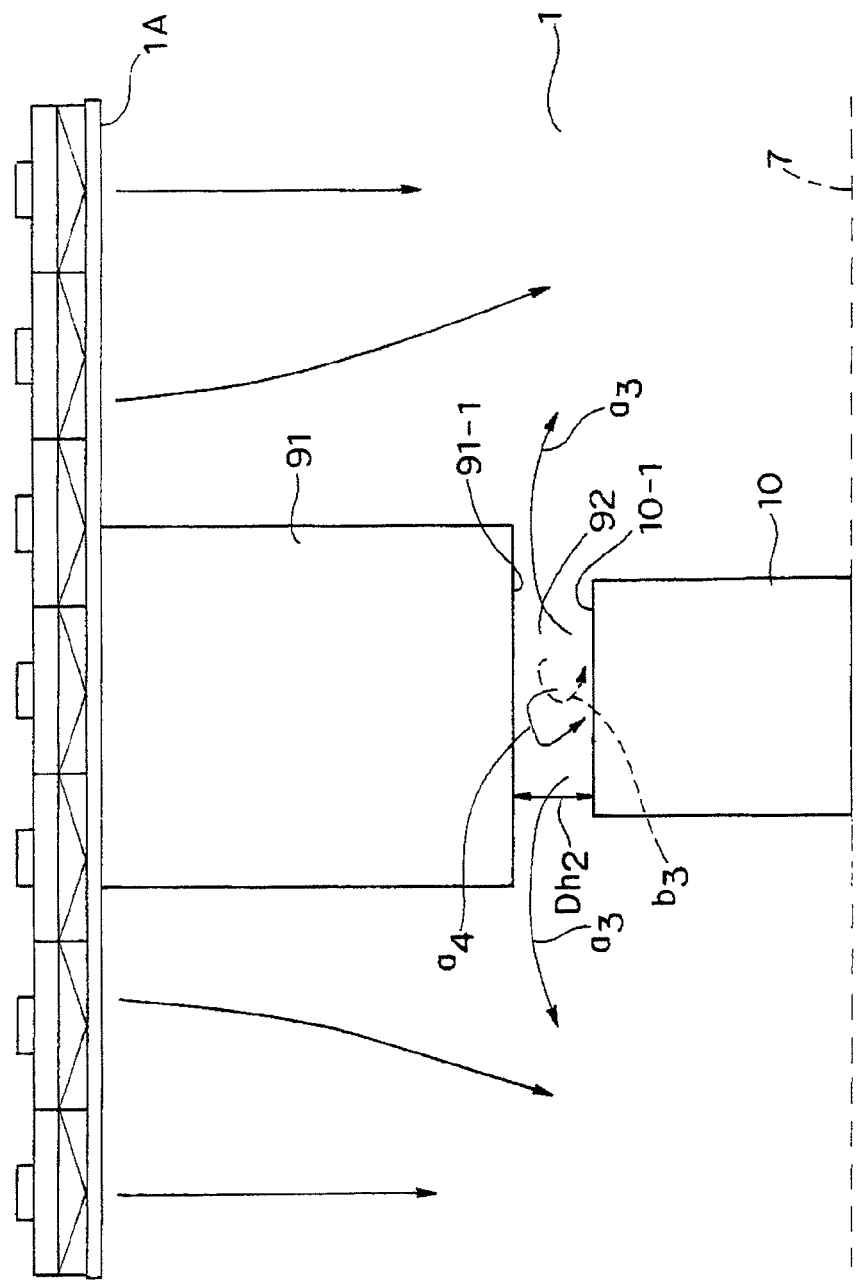
FIG. 5 is a schematic explanatory view that shows a clean room for use in comparison with the clean room of the first embodiment of the present invention, and explains ascending air flows from the heat radiating member and flows of the pollutant in a case where there is too short a distance between a top face of the heat radiating member and a dust-exhaust acceleration face of a dust-exhaust assistant member.

Here, as shown in FIG. 5, suppose that a box 91 having a flat face 91-1 facing the top face 10-1 of the heat radiating member 10 placed inside the clean chamber 1 in the vertical direction is simply placed in a manner so as to protrude downward from the ceiling 1A that faces the clean chamber 1. Here, a distance $Dh_2$ between the top face 10-1 of the heat radiating member 10 and the flat face 91-1 of the box 91 is made considerably shorter than the distance D of the present invention, and kept in a state located too closely. In this case, an ascending air flow rising from the top face 10-1 of the heat radiating member 10 due to heat generation of the heat radiating member 10 is allowed to immediately reach the flat face 91-1 of the box 91, and ascending air flows generated on the periphery of the top face 10-1 of the heat radiating member 10 are discharged from the center of a gap 92 outward as indicated by arrows $a_3$ of solid lines; however, ascending air flows generated on the periphery of the top face 10-1 of the heat radiating member 10 might be formed into a vortex in the center portion of the gap 92 as indicated by an arrow $a_4$ of a solid line, with the result that these air flows are hardly discharged outward from the center side of the gap 92. As a result, by the ascending air flow forming a whirl as indicated by the arrow $a_4$ of a solid line, pollutants, such as dust or chemical substances, generated on the upper portion of the heat radiating member 10 or on the periphery thereof, tend to drop onto the top face 10-1 of the heat radiating member 10, as indicated by an arrow $b_3$ of a dotted line, giving adverse effects to the clean environment.

Based upon the above-mentioned considerations, the distance D needs to be set to such a distance D as to allow all the ascending air flows rising from the top face 10-1 of the heat radiating member 10 due to heat generation of the heat radiating member 10 to be discharged outside the gap 22 between the dust-exhaust acceleration face 15-1 of the dust-exhaust assistant member 15 and the top face 10-1 of the heat radiating member 10, by the dust-exhaust acceleration face 15-1 of the dust-exhaust assistant member 15.

In order to further examine the distance specifically, the following description will discuss working examples shown below.

Working Example 1

Referring to drawings, the following description will explain specific working examples of the embodiments of the present invention.

A clean room serving as working example 1, as shown in FIG. 1, is provided with a clean chamber 1 serving as an industrial clean room, that has a height of 3.5 m, a ceiling room 2 having a height of 3 m, and an under floor room 8 having a height of 2.5 m, and has a size of 12 m in the lateral direction and 10 m in the depth direction. Moreover, a grating floor 7 having an open efficiency of 45% is adopted therein.

The clean room relating to working example 1 that embodies the present invention is mainly used as a semiconductor manufacturing room and a semiconductor inspection room, and in order to maintain the managing temperature of machine and inspection areas in a range from ±0.5° C., the managing moisture to 50%, the managing cleanliness factor to JIS class 1 or less (class 10 or less in ISO standard) and the managing cleanliness factor of maintenance areas other than the machine and inspection areas to JIS class 2 to 3 (class 100 to 1000 in ISO standard), a circulating air flow is set at a temperature of 22° C., a moisture of 50%, and a gas quantity of about 300,000 m$^3$/h, a gas quantity of a circulating flow that is allowed to flow into the under floor chamber 8 through the grating floor 7 of the clean chamber 1 and return to the ceiling chamber 2 through the return flow passage 9 is set to 280,000 m$^3$/h, with the outer air corresponding to the remaining gas quantity of about 20,000 m$^3$/h being transported into the ceiling chamber 2 by the air-supply guide flow passage 12, while being supplied as a supply air through the air-supply inlet 12a formed in the air-supply guide flow passage 12, and the number of ventilations inside the clean room is held to 250 times/hour. In order to efficiently send the circulating air into the clean chamber 1, 240 fan filter units 3 are placed on the face of the ceiling 1A of the clean chamber 1 with equal intervals. Here, the fan filter units 3 are fan filter units made by Apiste Corporation, which have an air blowing capability of 1200 m$^3$/h, and each of them is provided with a ULPA filter (possibility of collecting dust particles having a size of 0.1 μm or more: 99.99999%) serving as the high efficiency filter 6. An air flow in the downward vertical direction in the clean chamber 1, which had passed through the ULPA filter under these operation conditions, was measured by using an anemometer made by Testo K.K. at a position having a height of 1 m in the clean chamber 1, with the result that a flow having a flow rate of 0.3 to 0.5 m/s was obtained.

Moreover, in the clean chamber 1, the circulating flow of the clean chamber 1 was warmed by thermal loads of a first heat radiating member 10C, a second heat radiating member 10B, and a third heat radiating member 10A, such as various semiconductor manufacturing devices or various inspection devices, as shown in FIG. 1. Temperature measurements were carried out three times at flow-in positions into the under floor chamber 8 through the grating floor 7 of the clean chamber 1, and as a result, the averaged temperature of measured temperatures was 24° C. In order to cool this temperature higher than the ambient temperature inside the clean chamber 1 by 1° C. to a predetermined temperature, by setting the temperature of the air-conditioning device 14 to 22° C., the temperature in the clean chamber 1 was maintained at 23° C. by the effects of the thermal loads of the respective heat radiating members 10.

Here, in the clean room relating to working example 1 that embodies the present invention, 0.1 μm was used as a reference size of dust or chemical substances that give adverse effects to the quality.

Under these operation conditions of the clean room, the first heat radiating member 10C of FIG. 1 is a device used as a semiconductor inspection device, and the shape of the first heat radiating member 10C is a cubic shape (rectangular parallelepiped), with each side being set to 1 m, and the power supply capacity thereof is 6500 W/h. The surface temperature of the top face 10c-1 of the first heat radiating member 10C was measured by a contact-type thermometer made by Testo K.K., with the result that the surface temperature $T_C$ of the top face 10c-1 varied from 23° C. to 75° C., depending on the contents of operations, such as a semiconductor inspecting operation carried out on the first heat radiating member 10C or a transporting operation for a semiconductor waver carried out on the first heat radiating member 10C, with a temperature difference $(T_c-T_e)=\Delta T$ from the ambient temperature $T_e$ in the clean chamber 1 being about 0° C. to 50° C.

A transparent box (1.5 m in longitudinal length×1.5 m in lateral length×2.0 m in height) was formed between the top face 10c-1 of the first heat radiating member 10C and the face of the ceiling 1A as one example of the first dust-exhaust assistant member 15C by securing the respective sides of acrylic resin members having a quadrangular plate shape with a thickness of 3 mm to one another by using a plastic adhesive material, and the respective bonded faces were sealed with Kapton tapes so as to improve the air tightness inside the box. By suspending this box from a beam of the ceiling 1A above the first heat radiating member 10C so that the dust-exhaust acceleration face 15c-1 of the first dust-exhaust assistant member 15C was disposed in a manner so as to face the top face 10c-1 of the first radiating member 10C in the vertical direction, an arrangement was made as if the ceiling 1A protruded downward.

Under these implementation conditions, the semiconductor inspection device corresponding to the first heat radiating member 10C was operated for 24 hours so that the number of pollutants was measured by a dust counter (Type P-3, made by Yamatake Corporation) of a light diffusing system provided in the semiconductor inspection device. FIG. 6 shows the results thereof.

In accordance with working example 1 having this structure, the amount of dust (number of dust particles) and chemical substances that would give adverse effects to the quality could be reduced by 75% in comparison with the number of the measured pollutants prior to the installation of the first dust-exhaust assistant member 15C.

Working Example 2

In the same structure as that of working example 1, the second heat radiating member 10B of FIG. 1 is a device used as a semiconductor dry etching device, and the shape of the second heat radiating member 10B has a height of 1.5 m, with longitudinal and lateral widths being set to 1 m, and the power supply capacity thereof is 12500 W/h. The surface temperature $T_b$ of the top face 10b-1 of the second heat radiating member 10B was measured by a contact-type temperature made by Testo K.K. in the same manner, with the result that the surface temperature $T_b$ of the top face 10b-1 varied from 73° C. to 99° C., depending on the semiconductor etching state carried out on the second heat radiating member 10B or the number of wafers to be processed therefor, with a temperature difference $(T_b-T_c)=\Delta T$ of the clean chamber 1 from the ambient temperature $T_e$ being about 50° C. to 75° C.

A transparent box (1.5 m in longitudinal length×1.5 m in lateral length×0.7 m in height) was formed between the top face 10b-1 of the second heat radiating member 10B and the ceiling face as one example of the second dust-exhaust assistant member 15B by securing the respective sides of acrylic resin members having a quadrangular plate shape with a thickness of 3 mm to one another by using a plastic adhesive material, and the respective bonded faces were sealed with Kapton tapes so as to improve the air tightness inside the box. By suspending this box from a beam of the ceiling 1A above the second heat radiating member 10B so that the dust-exhaust acceleration face 15b-1 of the second dust-exhaust assistant member 15B was disposed in a manner so as to face the top face 10b-1 of the second radiating member 10B in the vertical direction, an arrangement was made as if the ceiling 1A protruded downward.

Under these operation conditions, the semiconductor dry etching device was operated for 24 hours so that the number of pollutants was measured by a dust counter (Type P-3, made by Yamatake Corporation) of a light diffusing system provided in the semiconductor dry etching device. FIG. 6 shows the results thereof.

In accordance with working example 2 having this structure, the number of dust particles and chemical substances that would give adverse effects to the quality could be reduced by 50% in comparison with the number of the measured pollutants prior to the installation of the second dust-exhaust assistant member 15B.

Working Example 3

In the same structure as that of working example 1, the third heat radiating member 10A of FIG. 1 is a device used as a semiconductor diffusion furnace, and the shape of the third heat radiating member 10A has a cubic shape (rectangular parallelepiped) having each side of 1 m, and the power supply capacity thereof is 42500 W/h. The surface temperature of the top face 10a-1 of the third heat radiating member 10A was measured by a contact-type temperature made by Testo K.K. in the same manner, with the result that the surface temperature $T_a$ of the top face 10a-1 varied from 93° C. to 130° C., depending on the semiconductor heating treatment state carried out on the third heat radiating member 10A or the number of wafers to be processed therefor, with a temperature difference $(T_a-T_e)=\Delta T$ of the clean chamber 1 from the ambient temperature $T_e$ being about 75° C. to 100° C.

A transparent box (1.5 m in longitudinal length×1.5 m in lateral length×0.8 m in height) was formed between the top face 10a-1 of the third heat radiating member 10A and the ceiling face as one example of the third dust-exhaust assistant member 15A by securing the respective sides of acrylic resin members having a quadrangular plate shape with a thickness of 3 mm to one another by using a plastic adhesive material, and the respective bonded faces were sealed with Kapton tapes so as to improve the air tightness inside the box. By suspending this box from a beam of the ceiling 1A above the third heat radiating member 10A so that the dust-exhaust acceleration face 15a-1 of the third dust-exhaust assistant member 15A was disposed in a manner so as to face the top face 10a-1 of the third radiating member 10A in the vertical direction, an arrangement was made as if the ceiling 1A protruded downward.

Under these implementation conditions, the semiconductor diffusion furnace was operated for 24 hours so that the number of pollutants was measured by a dust counter (Type P-3, made by Yamatake Corporation) of a light diffusing system provided in the semiconductor dry etching device. FIG. 6 shows the results thereof.

In accordance with working example 3 having this structure, the number of dust particles and chemical substances that would give adverse effects to the quality could be reduced by 50% in comparison with the number of the measured pollutants prior to the installation of the third dust-exhaust assistant member 15A.

Here, in working examples 1, 2 and 3, the above-mentioned structures are adopted as the operation conditions of the clean room, the heat generating conditions of the heat radiating member 10, the shapes of the dust-exhaust assistant member 15 and the dust-exhaust acceleration face 15-1, and the like; however, the present invention is not intended to be limited by these.

Moreover, onto the surface of the dust-exhaust assistant member 15 that is a transparent box used for forming the dust-exhaust assistant member 15, a gas mainly including "cation-based compound and ethyl alcohol" is sprayed for anti-static purpose so that an anti-static layer 60 described later is formed. By the effects of the anti-static layer, dust and chemical substances can be prevented from adhering to the transparent box.

Furthermore, in a case where an illumination device for illuminating the clean chamber 1 is placed on the ceiling chamber side, the dust-exhaust assistant member 15 is preferably prepared as a transparent or semi-transparent member, and even in a case where the transparent or semi-transparent dust-exhaust assistant member 15 is placed, since the illumination light is transmitted through the transparent or semi-transparent dust-exhaust assistant member 15, the luminance is not lowered so that high working efficiency is ensured.

Working Example 4

In the structure in accordance with working example 1, a thermal fluid analyzing process was carried out by using thermal fluid analyzing software (stream) made by Software Cradle Co., Ltd., with the distance between the heat radiating member 10 placed in the clean room and the ceiling 1A facing the clean room and the temperature difference between the surface temperature of the top face 10a-1 of the heat radiating member 10 and the ambient temperature $T_e$ of the clean chamber 1 serving as variables. The thermal fluid analyzing software, used here, is capable of precisely reproducing a fine curved face or slant face, and suitably used for analyzing overall flows.

Figure 7A:
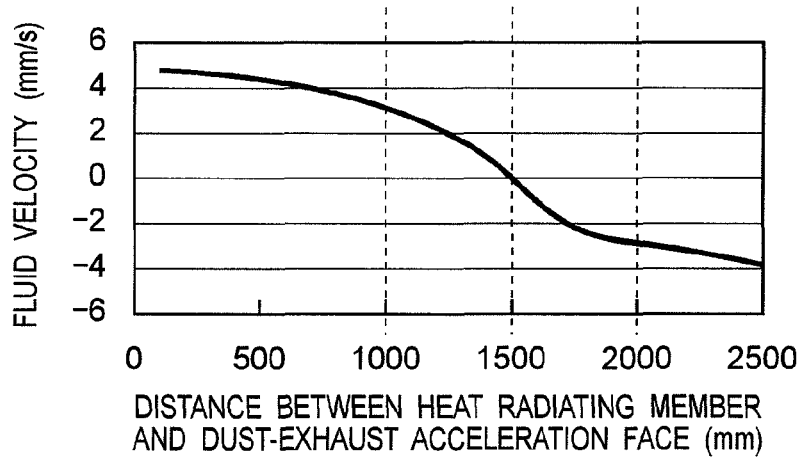
FIG. 7A is a view that shows the results of a thermal fluid analysis indicating a flow rate of an ascending gas generated relative to a distance between the heat radiating member and a ceiling.
Figure 7B:
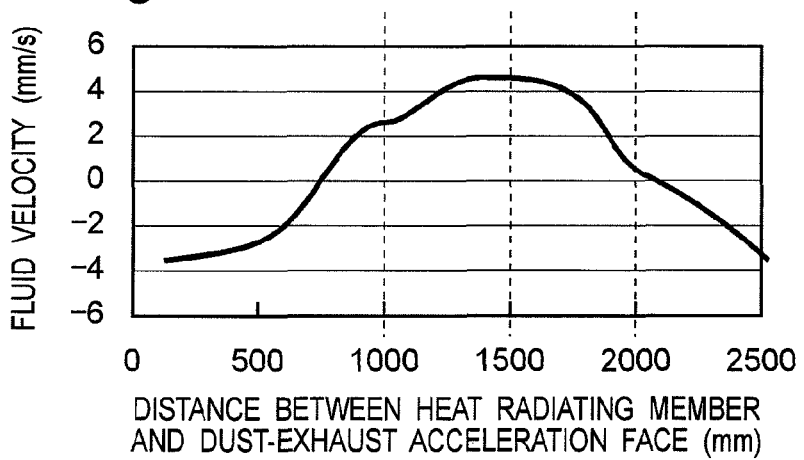
FIG. 7B is a view that shows the results of a thermal fluid analysis indicating a flow rate of an ascending gas generated relative to a distance between the heat radiating member and a ceiling.
Figure 7C:
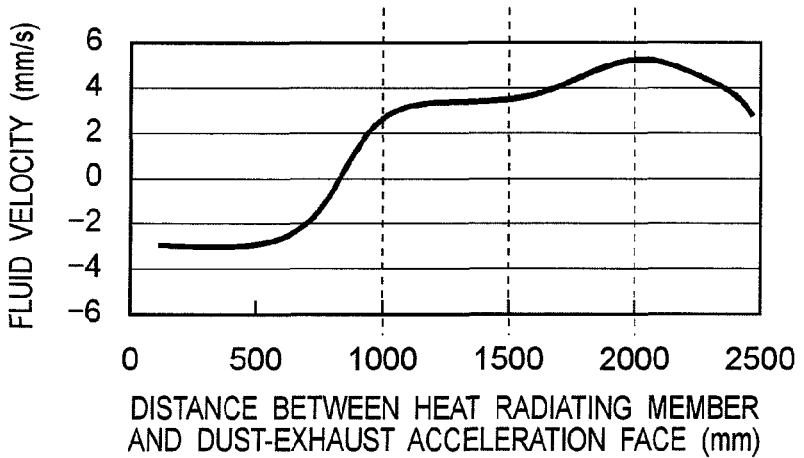
FIG. 7C is a view that shows the results of a thermal fluid analysis indicating a flow rate of an ascending gas generated relative to a distance between the heat radiating member and a ceiling.

In this case, the structure of working example 1 was formed into an analyzing model with one million factors, and the relationship between the distance from the top face 10-1 of the heat radiating member 10 to the dust-exhaust acceleration face 15c-1 of the first dust-exhaust assistant member 15C and a minimum velocity in the vertical direction of a air flow generated between the top face 10-1 of the heat radiating member 10 and the dust-exhaust acceleration face 15c-1 of the dust-exhaust assistant member 15C was thermal-fluid analyzed. FIGS. 7A to 7C show the results thereof. FIGS. 7A, 7B, and 7C respectively correspond to the first heat radiating member 10C, the second heat radiating member 10B, and the third heat radiating member 10A shown in FIG. 1. From the results shown in FIG. 7A, it is found that as the distance D from the top face 10-1 of the heat radiating member 10 to the dust-exhaust acceleration face 15c-1 of the first dust-exhaust assistant member 15C increases, the ascending velocity reduces, and that in a case where the distance from the top face 10-1 of the heat radiating member 10 to the dust-exhaust acceleration face 15c-1 of the first dust-exhaust assistant member 15C is 1500 mm or more, there are air flows that are not ascending air flows, but downward air flows in the vertical direction on the upper portion of the top face 10-1 of the heat radiating member 10. Moreover, from the results shown in FIGS. 7B and 7C, it is found that in a case where the distance from the top face 10-1 of the heat radiating member 10 to the dust-exhaust acceleration face 15c-1 of the first dust-exhaust assistant member 15C is about 700 mm or less, a convection is generated with the result that there are air flows that are not ascending air flows, but downward air flows in the vertical direction on the upper portion of the top face 10-1 of the heat radiating member 10.

The results shown in FIGS. 7A to 7C of the thermal fluid analysis thus carried out are summarized on the minimum velocity in the vertical direction of each of air flows generated between each of the top faces 10c-1, 10b-1, and 10a-1 of the heat radiating members 10C, 10B, and 10A and each of the dust-exhaust acceleration faces 15c-1, 15b-1, and 15a-1 of the dust-exhaust assistant members 15C, 15B, and 15A, within three temperature difference ranges (0 to 50° C., 50 to 75° C., and 75 to 100° C.) between the surface temperature of the top face 10-1 of the heat radiating member 10 and the ambient temperature of the clean chamber 1, and three distance ranges (200 to 1000 mm, 1000 to 1500 mm, and 1500 to 2000 mm) between the top faces 10c-1, 10b-1, and 10a-1 of the heat radiating members 10C, 10B, and 10A and the dust-exhaust acceleration faces 15c-1, 15b-1, and 15a-1 of the dust-exhaust assistant members 15C, 15B, and 15A, and FIG. 8 shows the results thereof.

In working example 1 and working examples 2 and 3, based upon temperature differences (0 to 50° C., 50 to 75° C., and 75 to 100° C.) between the surface temperatures $T_c$, $T_b$, and $T_a$ of the top faces 10c-1, 10b-1, and 10a-1 of the heat radiating members 10C, 10B, and 10A and the ambient temperature of the clean chamber 1 as well as based upon the results of analyses carried out in structures in which, by suspending transparent boxes (dust-exhaust assistant members 15C, 15B, and 15A) having respectively different heights from beams of the ceiling 1A above the top faces 10c-1, 10b-1, and 10a-1 of the heat radiating members 10C, 10B, and 10A so that the dust-exhaust acceleration faces 15c-1, 15b-1, and 15a-1 of the dust-exhaust assistant members 15C, 15B, and 15A were formed so as to face the top faces 10c-1, 10b-1, and 10a-1 of the heat radiating members 10C, 10B, and 10A in the vertical direction, the distances $D_3$, $D_2$, and $D_1$ (500 mm, 1200 mm, and 1700 mm) were defined between the top faces 10c-1, 10b-1, and 10a-1 of the heat radiating members 10C, 10B, and 10A and the dust-exhaust acceleration faces 15c-1, 15b-1, and 15a-1 of the dust-exhaust assistant members 15C, 15B, and 15A, and the results shown FIG. 8 were combined therewith so that the minimum velocities in the vertical direction were respectively analyzed as 3.5 mm/s in the first heat radiating member 10C; 3.2 mm/s in the second heat radiating member 10B; and 3.9 mm/s in the third heat radiating member 10A.

Figure 2:
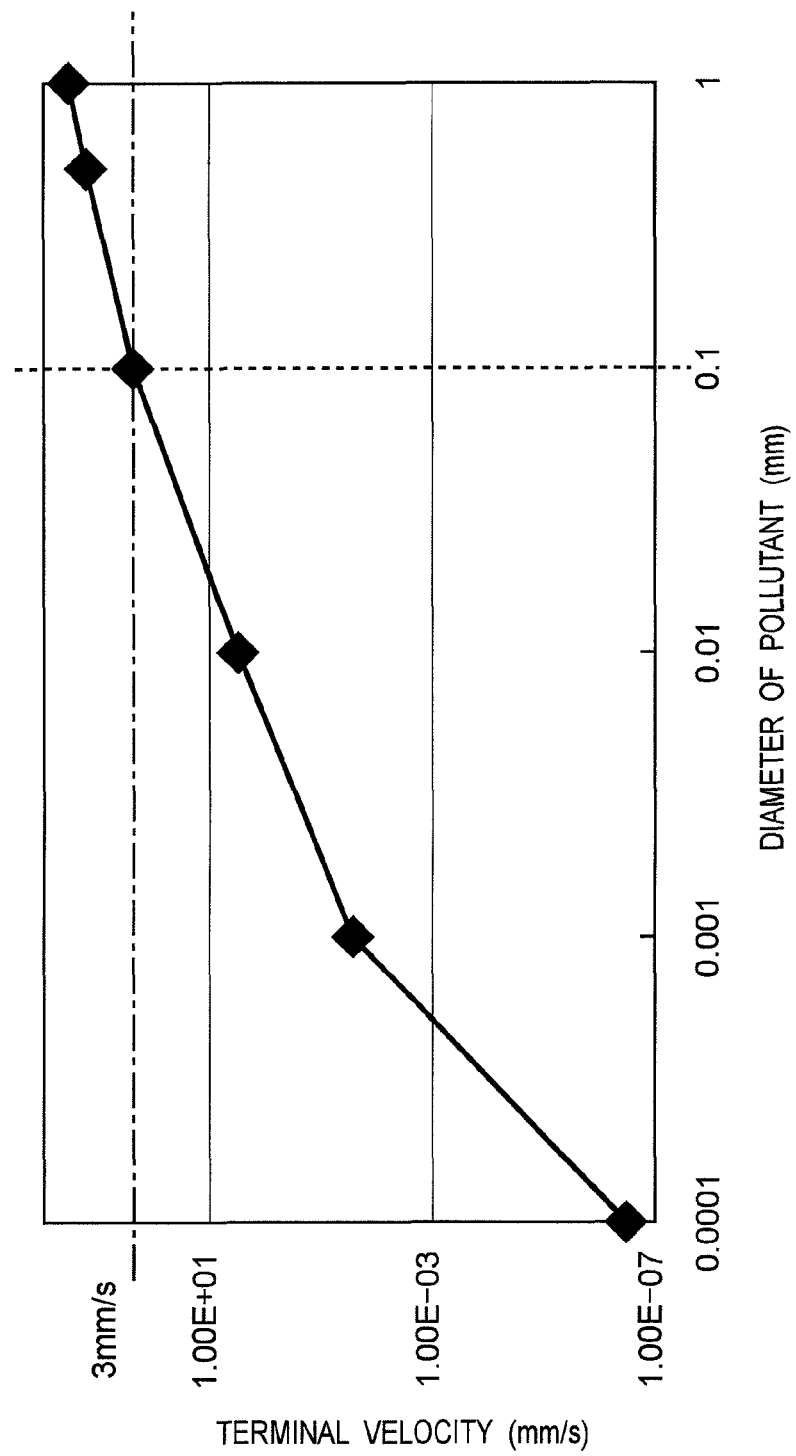
FIG. 2 is a view that shows experiment results indicating a terminal velocity (mm/s) relative to the diameter of a pollutant.

Here, in the clean rooms relating to working examples 1 to 3 that embody the present invention, 0.1 μm is used as a reference size of dust particles or chemical substances that give adverse effects to the quality, and from FIG. 2, it is found that the object has a falling velocity of 3 mm/s, when the object of 0.1 μm is balanced with air resistance while freely falling down in the air, with the falling velocity (terminal velocity) being not accelerated beyond a certain fixed velocity.

That is, examinations carried out in working example 1 and working examples 2 and 3 of the present invention indicate that gaps 22 between the top faces 10c-1, 10b-1, 10a-1 of the heat radiating members 10C, 10B, 10A and the dust-exhaust acceleration faces 15c-1, 15b-1, 15a-1 of the dust-exhaust assistant members 15C, 15B, 15A are occupied by ascending air flows, each having a velocity of 3 mm/s or more, with a falling velocity (terminal velocity) that is not accelerated beyond a fixed velocity being 3 mm/s, so that pollutants, such as dust and chemical substances, are balanced with air resistance, while freely falling, and consequently do not fall on the top faces 10c-1, 10b-1, 10a-1 of the heat radiating members 10C, 10B, and 10A.

The results of these are formed into a graph shown in FIG. 9 as the relationship between the temperature differences between the surface temperatures of the top faces 10c-1, 10b-1, and 10a-1 of the heat radiating members 10C, 10B, and 10A and the ambient temperature of the clean chamber 1 and the distances $D_3$, $D_2$, and $D_1$ from the top faces 10c-1, 10b-1, and 10a-1 of the heat radiating members 10C, 10B, and 10A to the dust-exhaust acceleration faces 15c-1, 15b-1, and 15a-1 of the dust-exhaust assistant members 15C, 15B, and 15A. As representative points of working example 1, black points at a temperature difference of 25° C. with a distance 500 mm are plotted on the left side. As representative points of working example 2, black points at a temperature difference of 55° C. with a distance 1300 mm are plotted on the left side. As representative points of working example 3, black points at a temperature difference of 85° C. with a distance 1700 mm are plotted on the left side. As a result, an area 99 between the slanting line I on the lower side that slants diagonally upward to the right and the slanting line II on the upper side that slants diagonally upward to the right corresponds to the area occupied by ascending air flows, each having a velocity of 3 mm/s or more, with the falling velocity (terminal velocity) of 3 mm/s being not accelerated beyond a certain fixed velocity. That is, in FIG. 9, a value K $(=\Delta T/D)$ (° C./mm), obtained by dividing the temperature difference T between the surface temperature of the top face 10-1 of the heat radiating member 10 and the ambient temperature by the distance D between the top face 10-1 of the heat radiating member 10 and the dust-exhaust acceleration face 15-1 of the dust-exhaust assistant member 15, is allowed to hold a relationship $0.032 \leq K \leq 0.065$. Here, the inclination K $(=\Delta T/D)$ (° C./mm) of the slanting line I on the lower side is defined as 0.032, and the inclination K $(=\Delta T/D)$ (° C./mm) of the slanting line II on the upper side is defined as 0.065.

Consequently, the layout is made so that, as the temperature difference between the surface temperature of the top face 10-1 of the heat radiating member 10 and the ambient temperature of the heat radiating member 10 becomes higher, the distance D between the top face 10-1 of the heat radiating member 10 and the dust-exhaust acceleration face 15-1 of the dust-exhaust assistant member 15 is made greater.

More specifically, in FIG. 1, the following arrangement is made.

By suspending the third dust-exhaust assistant member 15A from the beam of the ceiling 1A above the third heat radiating member 10A, the dust-exhaust acceleration face 15a-1 of the third dust-exhaust assistant member 15A is disposed to face the top face 10a-1 of the third heat radiating member 10A in the vertical direction so that the ceiling 1A is formed to protrude downward. Here, a distance between the top face 10a-1 of the third heat radiating member 10A and the dust-exhaust acceleration face 15a-1 of the third dust-exhaust assistant member 15A in the vertical direction is defined as $D_1$. Moreover, a temperature difference $(T_a-T_{e1})$ between the surface temperature $T_a$ of the top face 10a-1 of the third heat radiating member 10A and the ambient temperature $T_{e1}$ of the heat radiating member 10A is defined as $\Delta T_1$.

By suspending the second dust-exhaust assistant member 15B from the beam of the ceiling 1A above the second heat radiating member 10B, the dust-exhaust acceleration face 15b-1 of the second dust-exhaust assistant member 15B is disposed to face the top face 10b-1 of the second heat radiating member 10B in the vertical direction so that the ceiling 1A is formed to protrude downward. Here, a distance between the top face 10b-1 of the second heat radiating member 10B and the dust-exhaust acceleration face 15b-1 of the second dust-exhaust assistant member 15B in the vertical direction is defined as $D_2$. Moreover, a temperature difference $(T_b-T_{e2})$ between the surface temperature $T_b$ of the top face 10b-1 of the second heat radiating member 10B and the ambient temperature $T_{e2}$ of the heat radiating member 10B is defined as $\Delta T_2$.

By suspending the first dust-exhaust assistant member 15C from the beam of the ceiling 1A above the first heat radiating member 10C, the dust-exhaust acceleration face 15c-1 of the first dust-exhaust assistant member 15C is disposed to face the top face 10c-1 of the first heat radiating member 10C in the vertical direction so that the ceiling 1A is formed to protrude downward. Here, a distance between the top face 10c-1 of the first heat radiating member 10C and the dust-exhaust acceleration face 15c-1 of the first dust-exhaust assistant member 15C in the vertical direction is defined as $D_3$. Moreover, a temperature difference $(T_c-T_{e3})$ between the surface temperature $T_c$ of the top face 10c-1 of the first heat radiating member 10C and the ambient temperature $T_{e3}$ of the heat radiating member 10C is defined as $\Delta T_3$.

Therefore, supposing that (surface temperature $T_a$ of the top face 10a-1 of the third heat radiating member 10A)>(surface temperature $T_b$ of the top face 10b-1 of the second heat radiating member 10B)>(surface temperature $T_c$ of the top face 10c-1 of the first heat radiating member 10C), $\Delta T_2 > \Delta T_2 > \Delta T_3$ is satisfied.

Here, as the temperature difference between the surface temperature of the top face 10-1 of the heat radiating member 10 and the ambient temperature $T_e$ of the heat radiating member 10 becomes higher, an ascending air flow from the top face 10-1 of the heat radiating member 10 becomes larger; therefore, it is necessary to make larger the distance D between the top face 10-1 of the heat radiating member 10 and the dist-exhaust acceleration face 15-1 of the dust-exhaust assistant member 15.

Consequently, as shown in FIG. 1, $D_1 > D_2 > D_3$ needs to be satisfied.

In this manner, each of the dust-exhaust assistant members 15A, 15B, and 15C is designed individually or locally as a member or a block for assisting a dust-exhaust process on the top face 10-1 of the corresponding one of the heat radiating members 10 so that all the ascending air flows rising from the top face 10-1 of the heat radiating member 10 due to heat generation of the heat radiating member 10 are externally discharged from the gap 22 between the dust-exhaust acceleration face 15-1 of the dust-exhaust assistant member 15 and the top face 10-1 of the heat radiating member 10 by the dust-exhaust acceleration face 15-1 of the dust-exhaust assistant member 15. As a result, pollutants, such as dust and chemical substances, generated above the heat radiating member 10 or on the peripheral portion thereof, are discharged from the center side of the gap 22 outward together with the ascending air flows so that the pollutants are prevented from falling on the top face 10-1 of the heat radiating member 10, making it possible to prevent them from giving adverse effects to the clean environment. Therefore, it becomes possible to optimize air flows caused by whirling air flows or thermal convections generated on the upper portion side of each of the heat radiating members 10, such as various IC manufacturing devices or various kinds of inspection devices, and consequently to suppress dust, chemical substances, and the like from adhering onto a wafer and the like.

Here, the pollutants, discharged outward from the center side of the gap 22 by the ascending air flows, are allowed to flow into the under floor chamber 8 through the grating floor 7, together with clean air (see an arrow 70) supplied at a uniform flow rate toward the under-floor chamber 8 from the high efficiency filter 6 in the clean chamber 1, and is returned to the ceiling chamber 2 through the return flow passage 9 from the under floor chamber 8, so that dust thereof is removed by the high efficiency filter 6.

Here, the present invention is not intended to be limited by the embodiments, and various other modifications may be made therein.

For example, the above-mentioned embodiment has exemplified the clean room of a reflux type; however, the present invention is not intended to be limited by this, and the present invention may be applied to a clean room of a non-reflux type.

Moreover, the dust-exhaust acceleration face 15-1 is not limited to that having a plane face, and as shown in FIG. 10, a semi-spherical face 15-2 or a curved face, or a slanted face that slants in a downward convex shape toward the center of the dust-exhaust acceleration face 15-1 may be used. In short, such a face may be used that an ascending air flow $a_2$ rising from the top face 10-1 of the heat radiating member 10 is guided to flow outward from the gap 22 between the top face 10-1 of the heat radiating member 10 and the dust-exhaust acceleration face 15-1 smoothly without causing much vortex or the like. A corner portion 15-3 of the dust-exhaust acceleration face 15-1 may be shaped into a round-portion so that the ascending air flow $a_2$ can be discharged more smoothly.

Moreover, as shown in FIG. 11, onto the surface of the dust-exhaust assistant member 15 (at least, the dust-exhaust acceleration face 15-1), a gas mainly including "cation-based compound and ethyl alcohol" may be sprayed for anti-static purpose so that an anti-static layer 60 may be formed. With this structure, the anti-static layer 60 can prevent dust and chemical substances from adhering to the surface of the dust-exhaust assistant member 15 (at least, the dust-exhaust acceleration face 15-1) due to static electricity or the like.

Furthermore, instead of forming the anti-static layer 60, or in addition to the anti-static layer 60, as indicated by reference numeral 61 in FIG. 11, the dust-exhaust assistant member 15 itself, or the dust-exhaust acceleration face 15-1 may be grounded. This grounded state makes it possible to prevent dust and chemical substances from adhering to the surface of the dust-exhaust assistant member 15 (at least, the dust-exhaust acceleration face 15-1) due to static electricity or the like.

Moreover, the dust-exhaust assistant member 15 may be formed as a box, or may be made of an air packing. With this arrangement, upon installing the dust-exhaust assistant member 15, it becomes unnecessary to carry out a large-scale construction work on the ceiling, and it also becomes possible to install the dust-exhaust assistant member 15 on the ceiling 1A without the necessity of stopping the production activities. Moreover, it becomes possible to promote cost reduction, and also to control the production conditions and environmental conditions, such as cleanliness factor or temperature/moisture degree, to higher levels.

Figure 12:
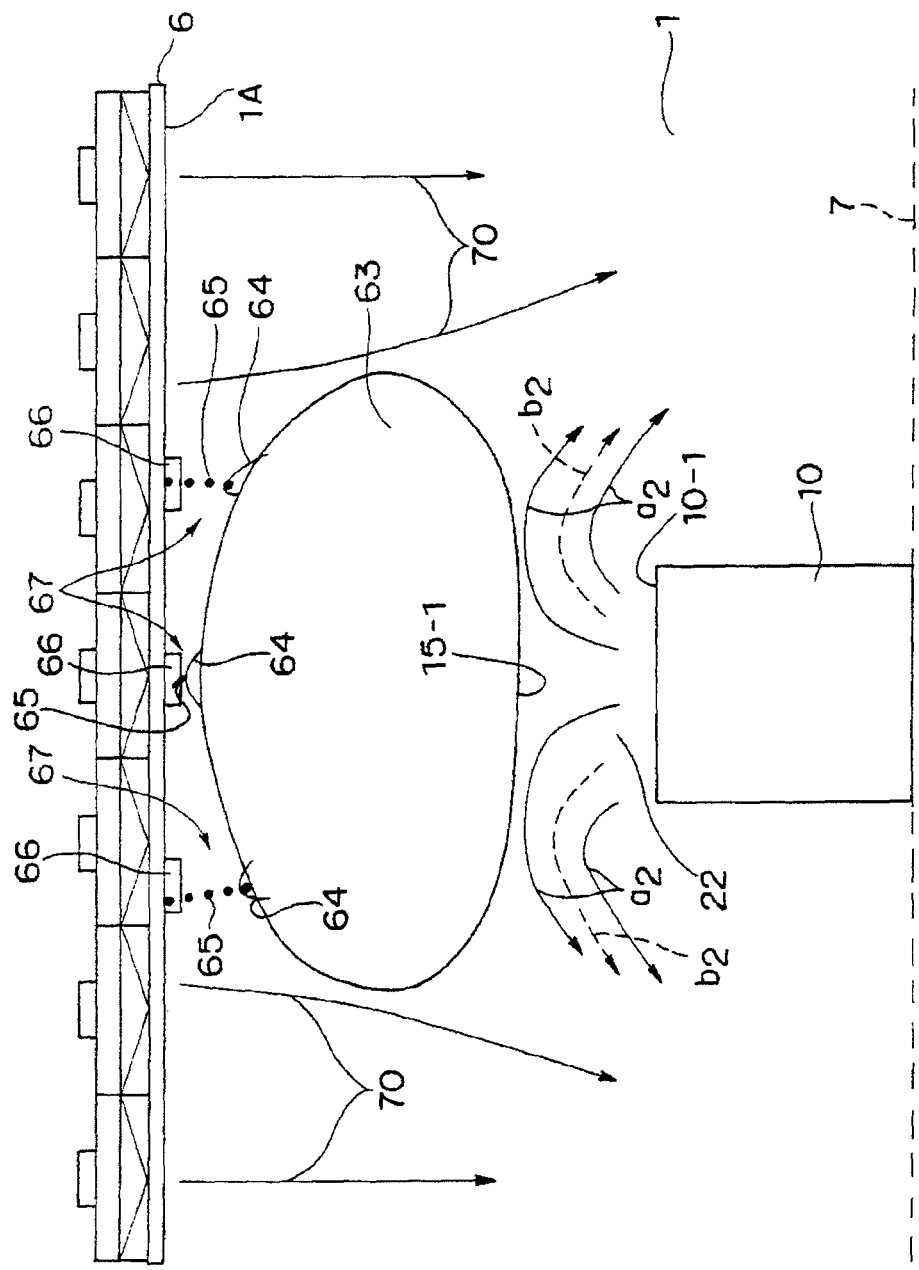
FIG. 12 is a schematic explanatory view that shows a clean room relating to still another modified example of the first embodiment of the present embodiment.

As shown in FIG. 12, the dust-exhaust assistant member 15 may be made of an air packing 63, and the air packing 63 may be disposed with a securing member 67 so that the air packing 63 can be moved in up and down directions relative to the ceiling 1A depending on the ascending air flow from the heat radiating member 10. More specifically, the securing member 67 may include a stopping member 64 for the upper portion of the air packing 63, a stopping member 66 for the ceiling 1A, a chain or a string coupling member 65 for coupling the two stopping members 64 and 66. With this arrangement, in a state where there is no ascending air flow from the heat radiating member 10, the air packing 63 is suspended from the ceiling 1A through the securing members 67 by its own weight of the air packing 63. When the ascending air flow $a_2$ from the heat radiating member 10 is exerted on the lower face of the air packing 63, that is, the dust-exhaust acceleration face 15-1, the air packing 63 is raised by the ascending air flow $a_2$ so that the distance between the dust-exhaust acceleration face 15-1 of the air packing 63 and the top face 10-1 of the heat radiating member 10 can be made slightly larger. That is, as the surface temperature of the top face 10-1 of the heat radiating member 10 becomes higher, the ascending air flow increases so that the air packing 63 is raised higher. As a result, as the temperature difference between the surface temperature of the top face 10-1 of the heat radiating member 10 and the ambient temperature of the heat radiating member 10 becomes higher, the distance D between the top face 10-1 of the heat radiating member 10 and the dust-exhaust acceleration face 15-1 of the dust-exhaust assistant member 15 can be made automatically greater so that the distance D can be automatically set to an optimal level.

Figure 13:
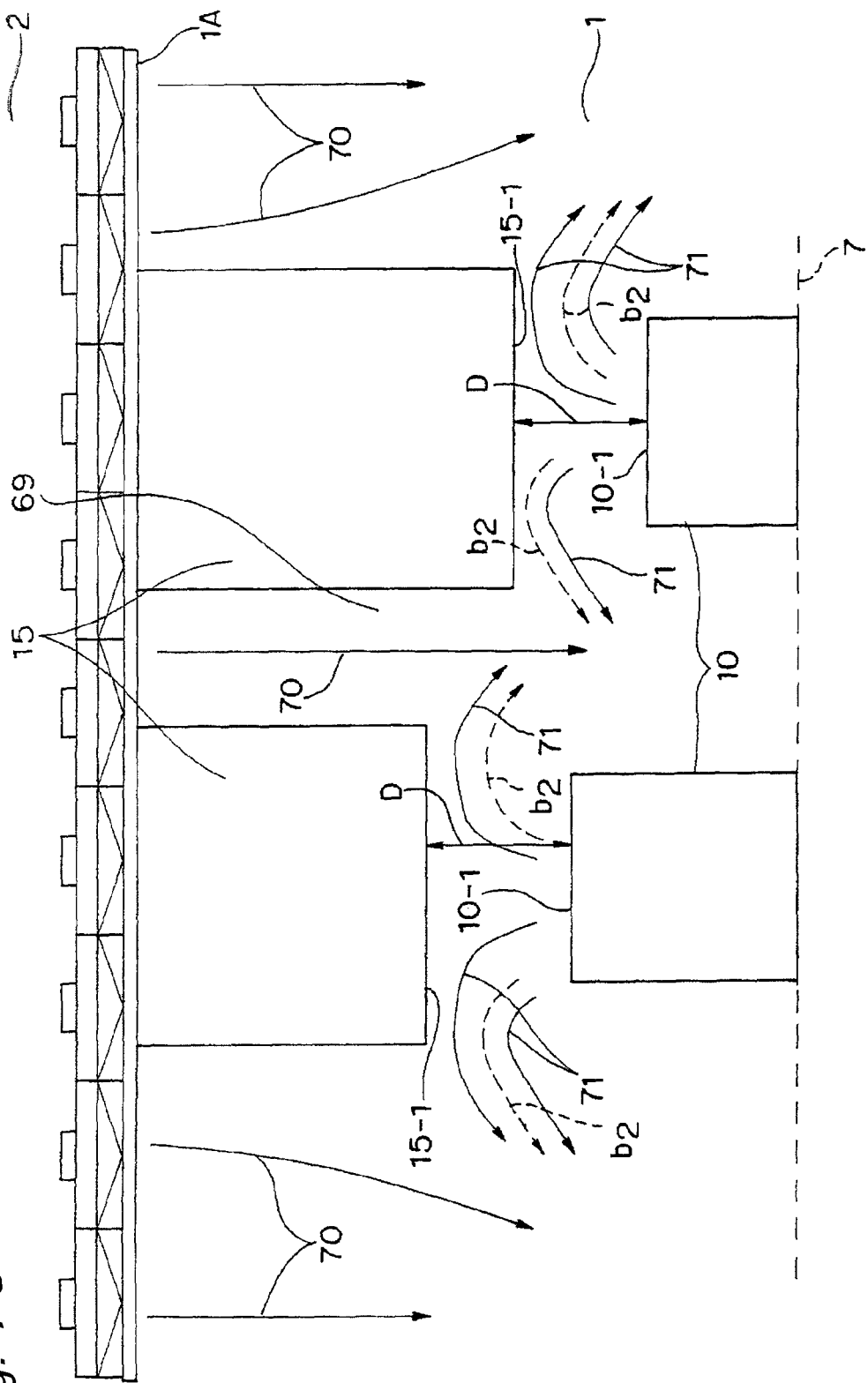
FIG. 13 is a schematic explanatory view that shows a clean room relating to still another modified example of the first embodiment of the present embodiment.
Figure 14:
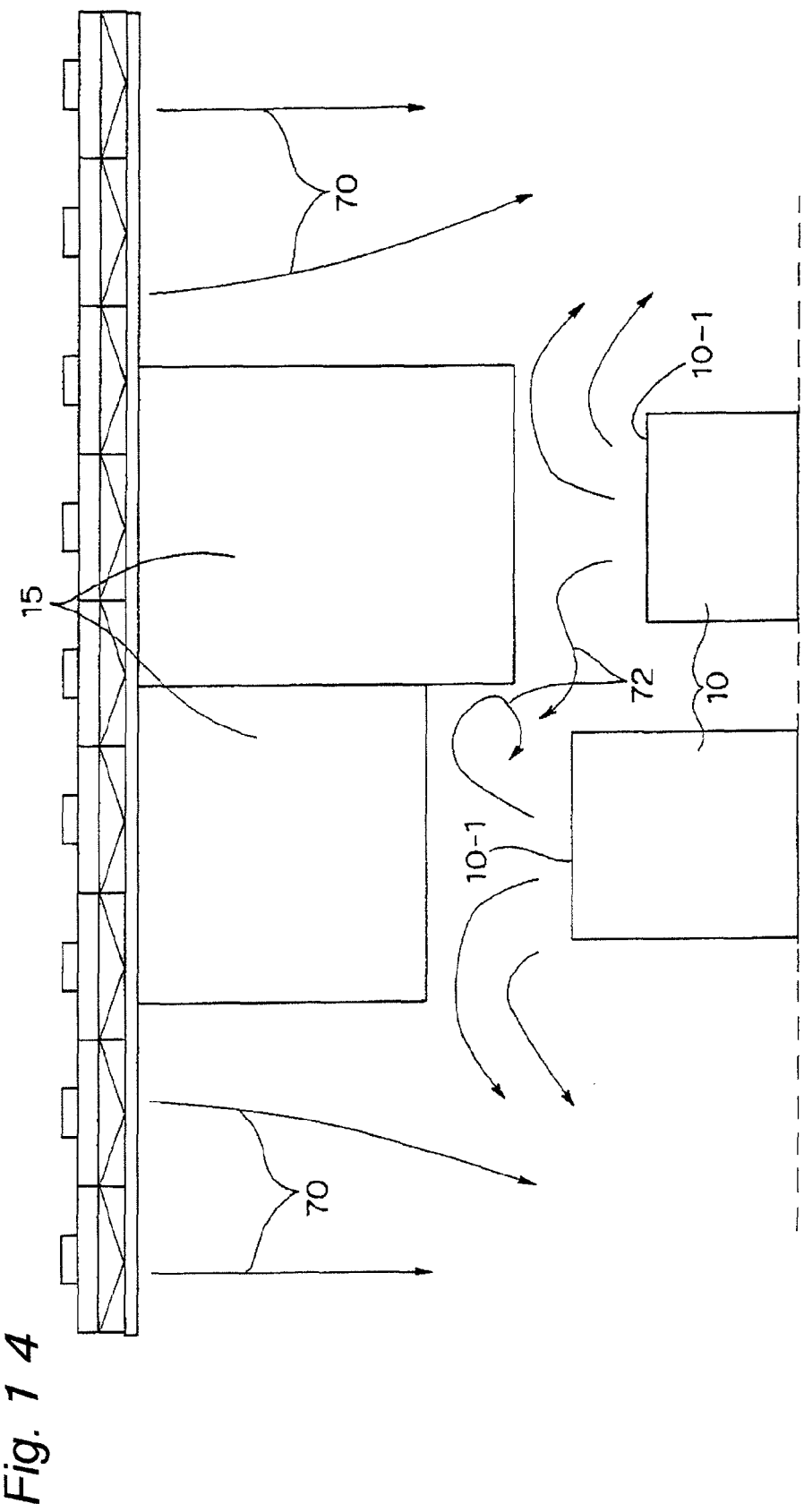
FIG. 14 is a schematic explanatory view that shows a comparative example with a clean room relating to still another modified example of the first embodiment of the present invention shown in FIG. 12.

Moreover, in a case where the heat radiating members 10 are placed on the grating floor 7 side by side, as shown in FIG. 13, a space 69 needs to be placed between the adjacent heat radiating members 10 so as to allow clean air flows 70 flowing from the ceiling chamber 2 into the clean chamber 1 downward in the vertical direction to flow in the space 69 so that it is necessary to discharge pollutants, such as dust and chemical substances, discharged therein from each of the gaps 22 between the adjacent heat radiating members 10 as indicated by arrows $b_2$ of dotted lines forcefully toward the grating floor 7 smoothly, together with the ascending air flows 71. Otherwise, if the adjacent heat radiating members 10 were made in contact with one another, or if they were placed without having any space in between as shown in FIG. 14, ascending air flows 72, discharged from the respective gaps 22 between the adjacent heat radiating members 10, would collide with one another to cause vortexes, resulting in the possibility that pollutants, such as dust or chemical substances, discharged from the respective gaps 22, might be flipped out to drop on the top faces 10-1 of the heat radiating members 10 adjacent to one another. Therefore, it becomes necessary to prepare at least the space 69 between the adjacent heat radiating members 10 so as to form the clean air flow 70 therein that is allowed to flow into the clean chamber 1 from the ceiling chamber 2 downward in the vertical direction.

With this arrangement, pollutants, such as dust and chemical substances, generated on the upper portion of each of the heat radiating members 10 or on the periphery thereof, are discharged from the top face of each of the heat radiating members 10 and allowed to positively drop onto the grating floor 7.

Figure 15:
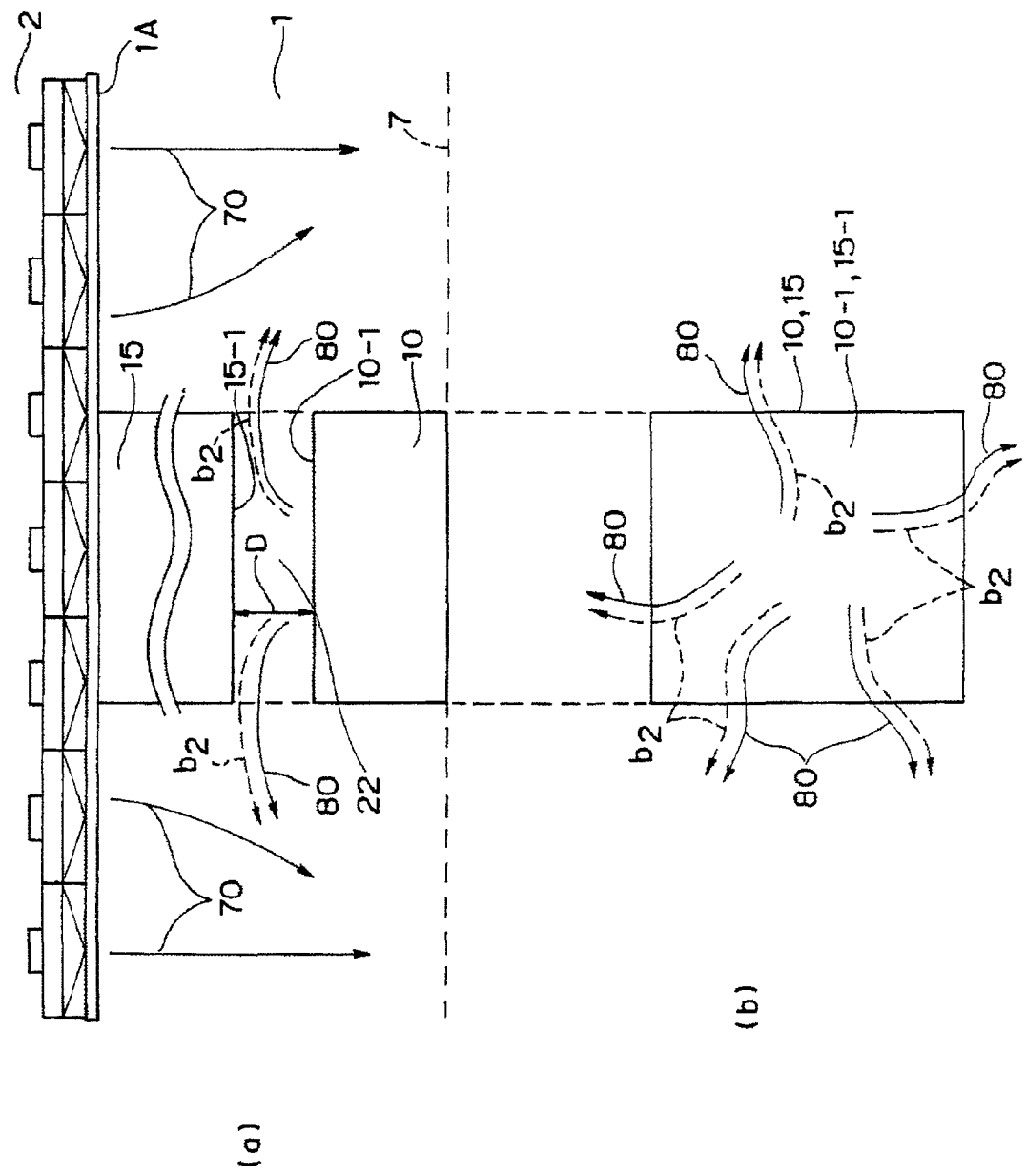
FIG. 15 is a view that explains a structure in which, in the clean room of the first embodiment of the present invention, the dust-exhaust acceleration face of the dust-exhaust assistant member and the top face of the heat radiating member have the same size (here, FIG. 15(a) showing the upper side from a floor is a schematic explanatory view, and FIG. 15(b) showing the lower side from the floor is a schematic perspective plan view, with a dotted line indicating the floor serving as a border)

Moreover, as shown in FIG. 15, the dust-exhaust acceleration face 15-1 of the dust-exhaust assistant member is preferably designed to cover virtually the entire face of the top face 10-1 of the heat radiating member 10. That is, it is preferable to allow the dust-exhaust acceleration face 15-1 of the dust-exhaust assistant member 15 and the top face 10-1 of the heat radiating member 10 to have virtually the same size. With this arrangement, compared to the arrangement of FIG. 15, all the ascending air flows 80 (corresponding to the ascending air flows $a_2$ in FIG. 3) rising from the top face 10-1 of the heat radiating member 10 due to heat generation of the heat radiating member 10 can be more positively accelerated to be discharged outside from the gap 22 having the distance D between the dust-exhaust acceleration face 15-1 of the dust-exhaust assistant member 15 and the top face 10-1 of the heat radiating member 10 by the dist-exhaust acceleration face 15-1 of the dust-exhaust assistant member so that it becomes possible to achieve the above-mentioned superior dust-exhaust effects. That is, as indicated by arrows $b_2$ of dotted lines, pollutants, such as dust and chemical substances, generated on the upper portion of the heat radiating member 10 or on the periphery thereof, are discharged outward from the center side of the gap 22 as shown by arrows $b_2$ of dotted lines together with ascending air flows indicated by arrows 80 of solid lines, thereby preventing the pollutants from dropping on the top face 10-1 of the radiating member 10 and giving adverse effects to the clean environment. Here, reference numeral 70 of FIG. 15 represents a clean air flow that is allowed to flow into the clean chamber 1 from the ceiling chamber 2 downward in the vertical direction.

Figure 16:
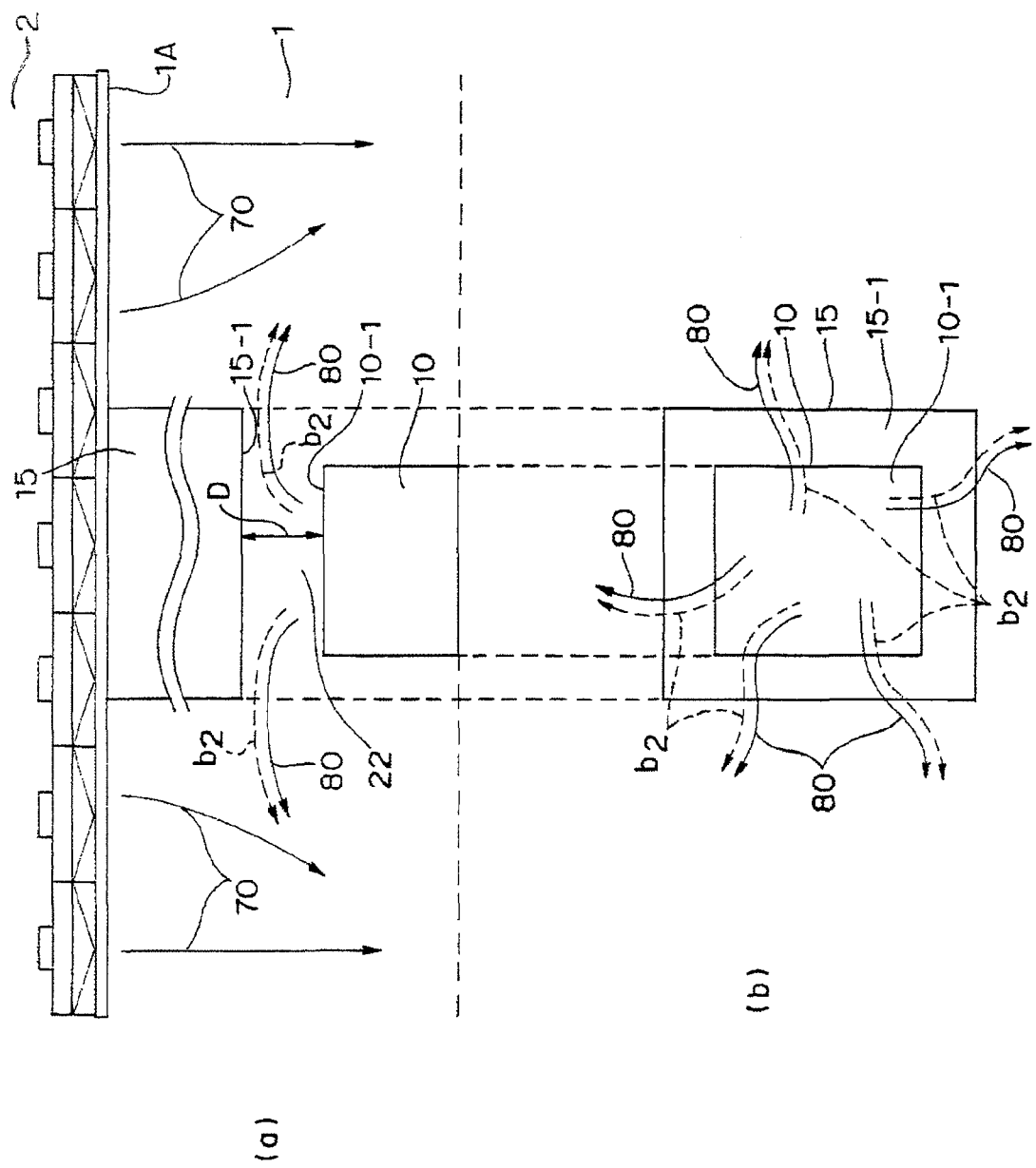
FIG. 16 is a view that explains a structure in which, in the clean room of the first embodiment of the present invention, the dust-exhaust acceleration face of the dust-exhaust assistant member is larger than the top face of the heat radiating member (here, FIG. 16(a) showing the upper side from a floor is a schematic explanatory view, and FIG. 16(b) showing the lower side from the floor is a schematic perspective plan view, with a dotted line indicating the floor serving as a border)

Moreover, as shown in FIG. 16, the dust-exhaust acceleration face 15-1 of the dust-exhaust assistant member 15 may be made larger than the top face 10-1 of the heat radiating member 10. That is, the dust-exhaust acceleration face 15-1 of the dust-exhaust assistant member may have such a size as to extend from the entire periphery of the top face 10-1 of the heat radiating member 10. With this arrangement, all the ascending air flows 80 rising from the top face of the heat radiating member 10 due to heat generation of the heat radiating member 10 can be accelerated to be positively discharged outside from the gap 22 between the dust-exhaust acceleration face 15-1 of the dust-exhaust assistant member 15 and the top face 10-1 of the heat radiating member 10 by the dust-exhaust acceleration face 15-1 of the dust-exhaust assistant member in comparison with the case of FIG. 15, so that it becomes possible to achieve the above-mentioned superior dust-exhaust effects more effectively. That is, as indicated by arrows $b_2$ of dotted lines, pollutants, such as dust and chemical substances, generated on the upper portion of the heat radiating member 10 or the periphery thereof, are accelerated to be positively discharged outward from the center side of the gap 22 together with ascending air flows indicated by arrows 80 of solid lines, thereby preventing the pollutants from dropping on the top face 10-1 of the radiating member 10 and giving adverse effects to the clean environment.

Figure 17:
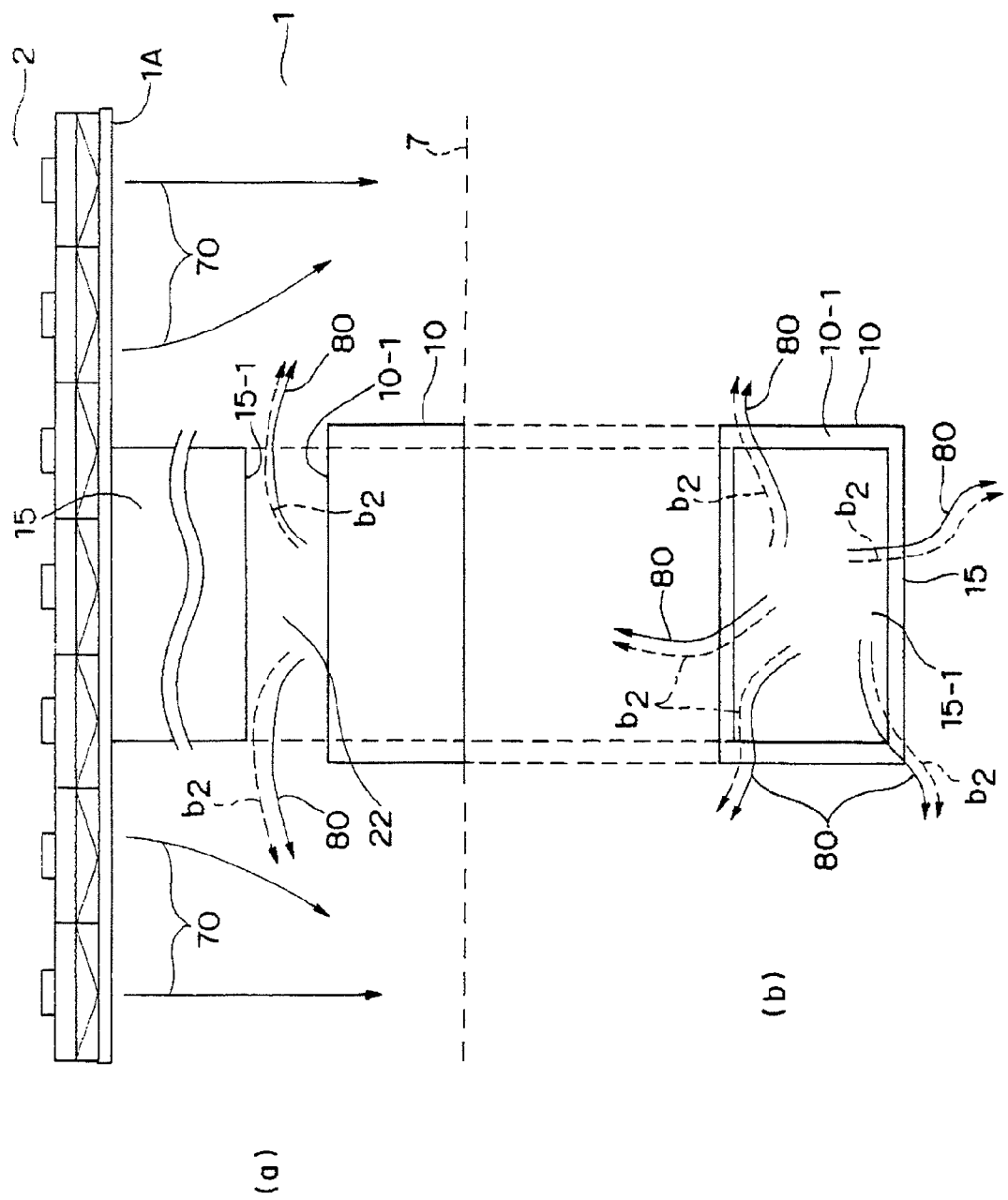
FIG. 17 is a view that explains a structure in which, in the clean room of the first embodiment of the present invention, the dust-exhaust acceleration face of the dust-exhaust assistant member is smaller than the top face of the heat radiating member (here, FIG. 17(a) showing the upper side from a floor is a schematic explanatory view, and FIG. 17(b) showing the lower side from the floor is a schematic perspective plan view, with a dotted line indicating the floor serving as a border)

Furthermore, as shown in FIG. 17, the dust-exhaust acceleration face 15-1 of the dust-exhaust assistant member 15 may be made slightly smaller than the entire surface of the top face 10-1 of the heat radiating member 10. That is, the dust-exhaust acceleration face 15-1 of the dust-exhaust assistant member 15 may have such a size slightly smaller than that of the top face 10-1 of the heat radiating member 10, that is, a size about 10% smaller in the area. With this arrangement also, virtually all the ascending air flows 80 rising from the top face 10-1 of the heat radiating member 10 due to heat generation of the heat radiating member 10 can be accelerated to be positively discharged outside from the gap 22 between the dust-exhaust acceleration face 15-1 of the dust-exhaust assistant member 15 and the top face 10-1 of the heat radiating member 10 by the dust-exhaust acceleration face 15-1 of the dust-exhaust assistant member 15, so that it becomes possible to achieve the above-mentioned superior dust-exhaust effects. That is, as indicated by arrows $b_2$ of dotted lines, pollutants, such as dust chemical substances, generated on the upper portion of the heat radiating member 10 or the periphery thereof, are accelerated to be positively discharged outward from the center side of the gap 22 together with ascending air flows indicated by arrows 80 of solid lines, thereby preventing the pollutants from dropping on the top face 10-1 of the radiating member 10 and giving adverse effects to the clean environment.

Figure 18:
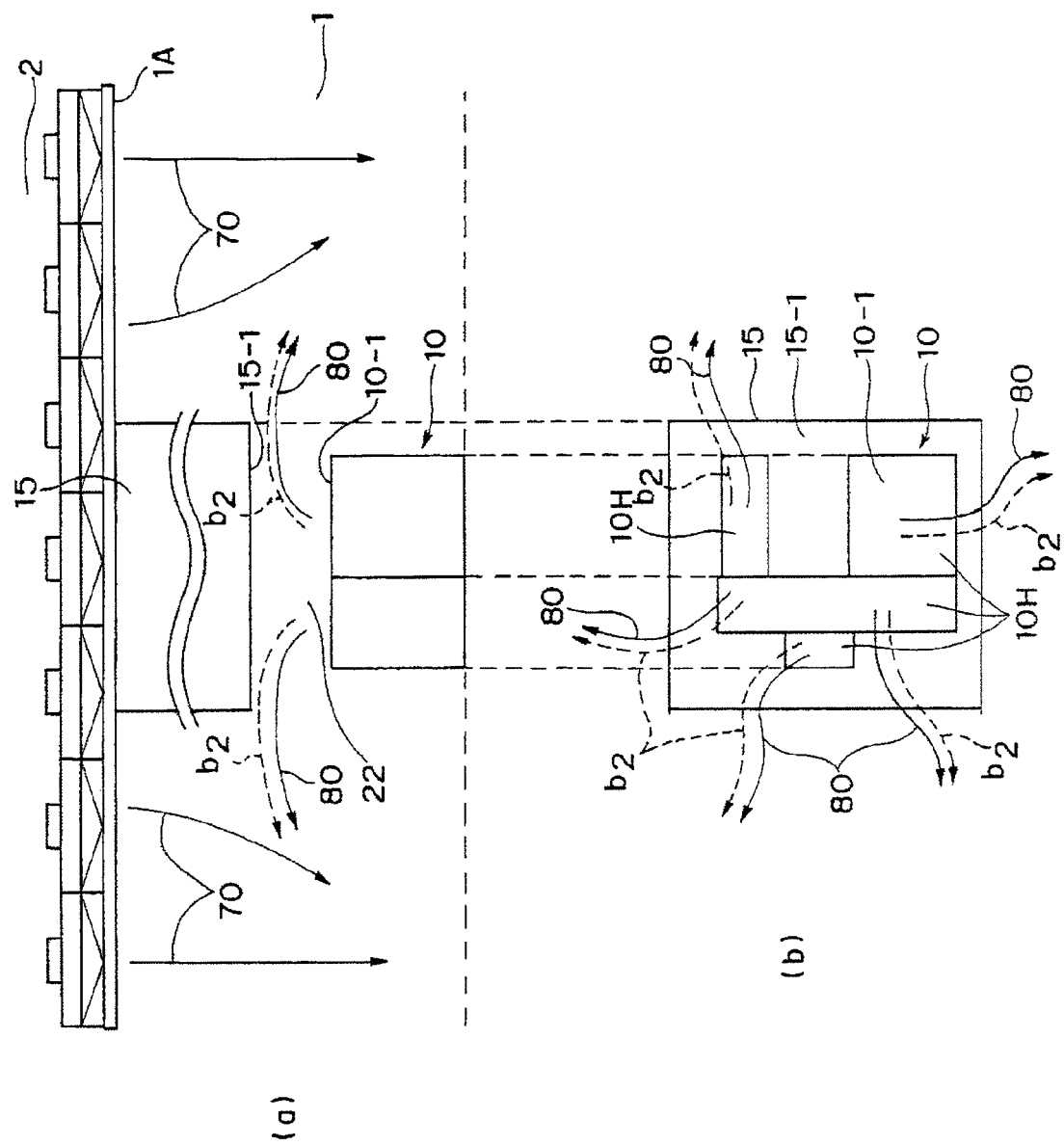
FIG. 18 is a view that explains a structure in which, in the clean room of the first embodiment of the present invention, there are a plurality of heat radiating sources in one heat radiating member (here, FIG. 18(a) showing the upper side from a floor is a schematic explanatory view, and FIG. 18(b) showing the lower side from the floor is a schematic perspective plan view, with a dotted line indicating the floor serving as a border)

Here, FIG. 18 is a view that explains a structure in which, in the clean room in accordance with the first embodiment of the present invention, a plurality of heat radiating sources 10H are present in one heat radiating member 10. In the foregoing description, each of the heat radiating members 10 is illustrated as a rectangular parallelepiped shape so as to simplify the drawing; however, in actual devices, those may have various complicated shapes other than the rectangular parallelepiped shape. For example, when illustrated in a slightly simplified manner, as shown in FIG. 18, heat radiating sources 10H, each having a rectangular parallelepiped shape, are disposed adjacent to one another in a schematically C-letter shape, and connected to each other, and ascending air flows 80 are considered to be generated due to heat generation of the respective heat generating sources 10H. In this case, with the heat radiating sources 10H being gathered into one unit, the dust-exhaust acceleration face 15-1 of the dust-exhaust assistant member 15 may be preferably placed so as to cover completely or virtually the entire heat radiating sources 10H. FIG. 18 shows an example in which the dust-exhaust acceleration face 15-1 of the dust-exhaust assistant member 15 is placed so as to completely cover all the heat radiating sources 10H. With this arrangement, all the ascending air flows 80 rising from the top face 10-1 (more specifically, top faces of the respective heat radiating sources 10H) of the heat radiating member 10 due to heat generation of the heat radiating sources 10H of the heat radiating member 10 can be accelerated to be positively discharged outside from the gap 22 between the dust-exhaust acceleration face 15-1 of the dust-exhaust assistant member 15 and the top face 10-1 of the heat radiating member 10 by the dust-exhaust acceleration face 15-1 of the dust-exhaust assistant body 15, so that it becomes possible to achieve the above-mentioned superior dust-exhaust effects. That is, as indicated by arrows $b_2$ of dotted lines, pollutants, such dust and chemical substances, generated on the upper portion of the heat radiating member 10 or the periphery thereof, are discharged outward from the center side of the gap 22 together with ascending air flows indicated by arrows 80 of solid lines, thereby preventing the pollutants from dropping on the top face 10-1 of the radiating member 10 and giving adverse effects to the clean environment.

In FIG. 1, the dust-exhaust assistant member 15 is disposed so as to protrude downward from the ceiling 1A facing the clean chamber 1; however, the present invention is not intended to be limited by this structure, and even when the structures of the following various modified examples are used, the same functions and effects as those of FIG. 1 can be obtained. In other words, in the present invention, the position of the dust-exhaust acceleration face 15-1 of the dust-exhaust assistant member 15 relative to the top face 10-1 of the heat radiating member 10 is important, and with respect to the securing method of the dust-exhaust assistant member 15, any desired securing method may be used in addition to the following structures.

Figure 19:
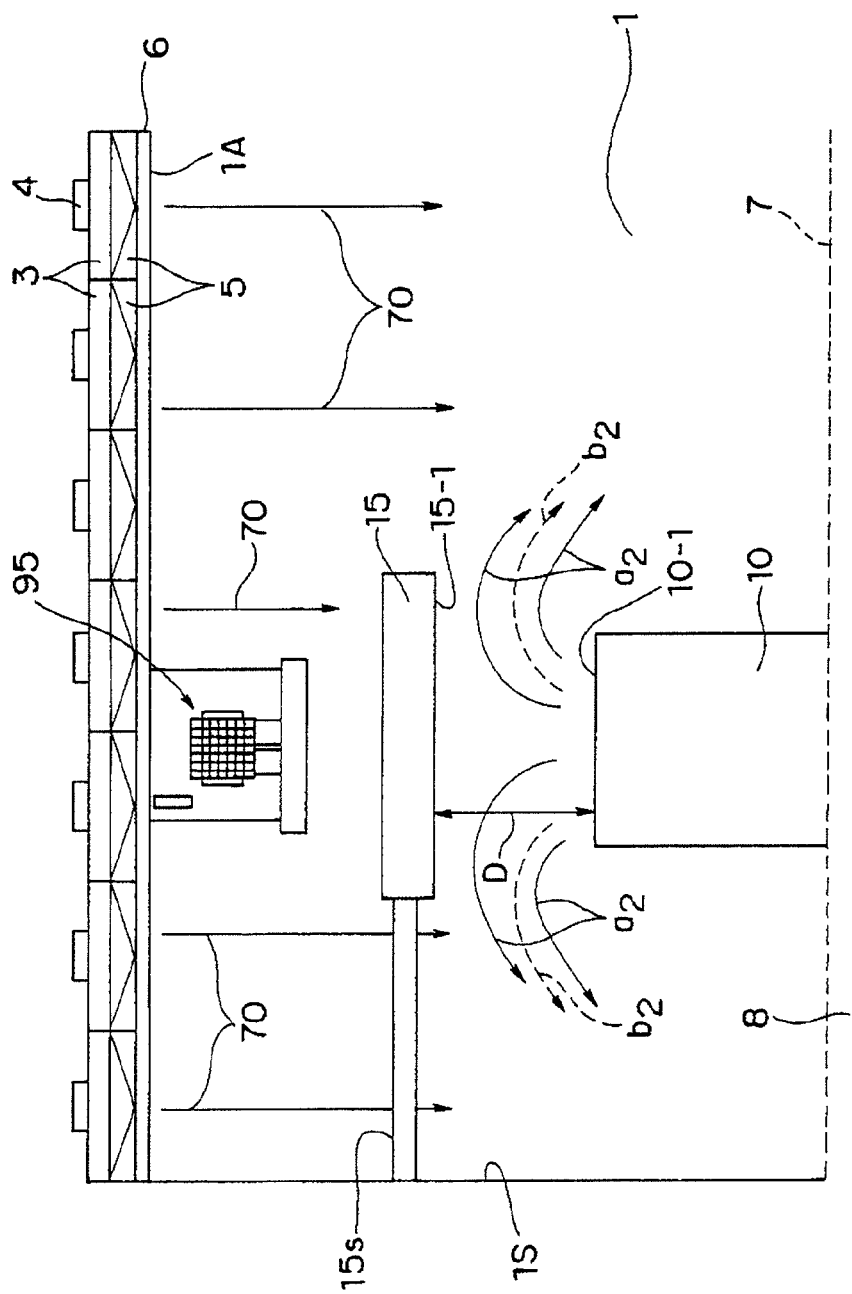
FIG. 19 is an explanatory view that explains a structure in which, in the clean room relating to the first modified example of the first embodiment of the present invention, the dust-exhaust assistant member is placed by using a supporting member interposed therebetween, the supporting member being extended not from a ceiling face, but from a side wall of the clean chamber.
Figure 20:
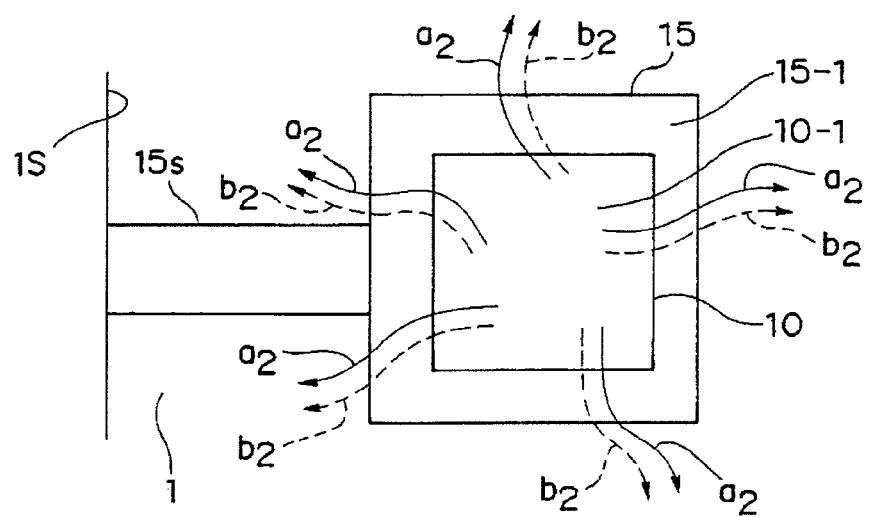
FIG. 20 is a schematic perspective plan view that explains the structure in which, in the clean room relating to the first modified example of FIG. 19, the dust-exhaust assistant member is placed by using the supporting member interposed therebetween.

For example, as a first modified example of the above-mentioned embodiment(s), another structure may be proposed in which, as shown in FIGS. 19 and 20, the dust-exhaust assistant member 15 is made to protrude from a side wall 1S of the clean chamber 1 by using a plate-shaped supporting member 15s interposed therebetween so that the dust-exhaust acceleration face 15-1 of the dust-exhaust assistant member 15 supported on the end portion of the supporting member 15s is made to face the top face 10-1 of the heat radiating member 10, with a distance D in between.

Figure 21:
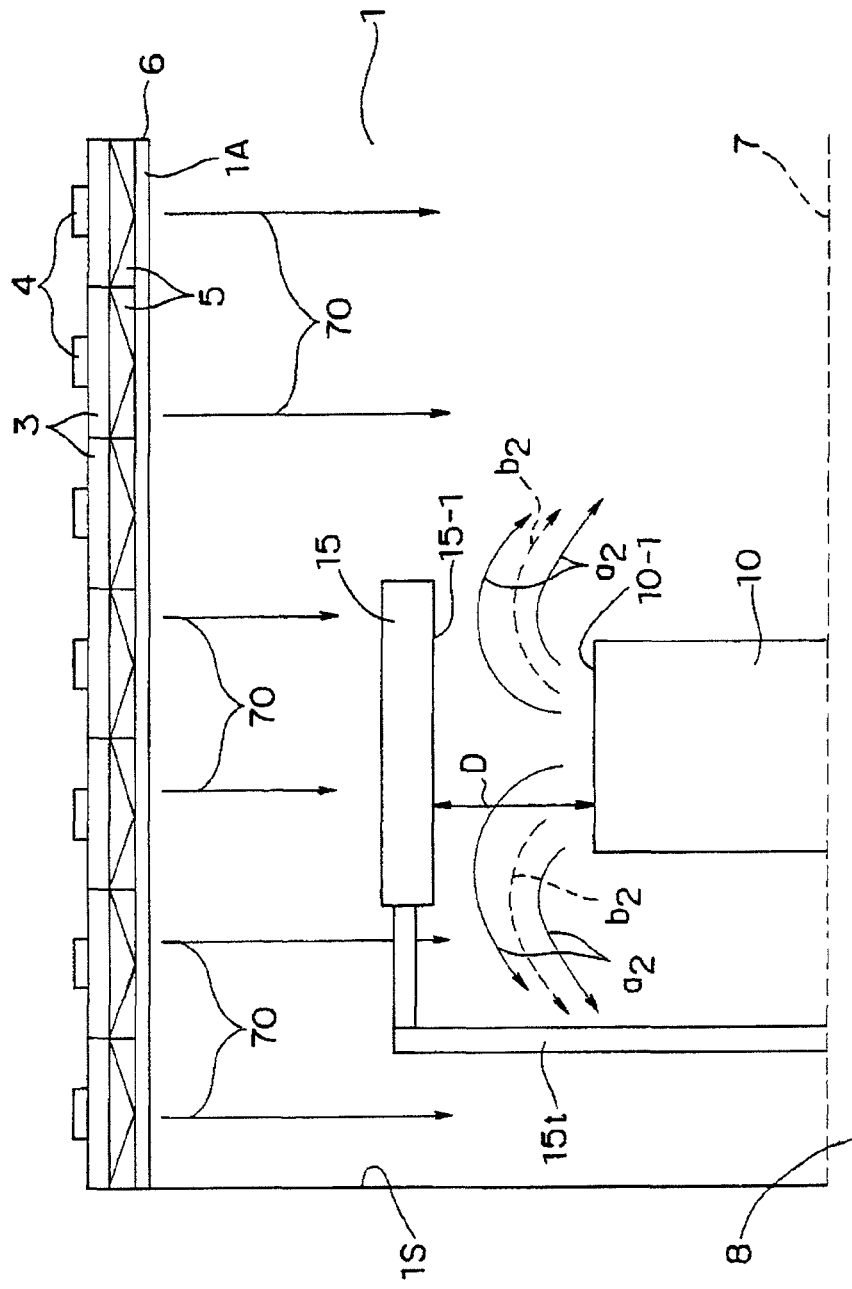
FIG. 21 is an explanatory view that explains a structure in which, in the clean room relating to the second modified example of the first embodiment of the present invention, the dust-exhaust assistant member is placed by using a supporting member interposed therebetween, the supporting member protruding and standing not from a ceiling face, but from a floor of the clean room.
Figure 22:
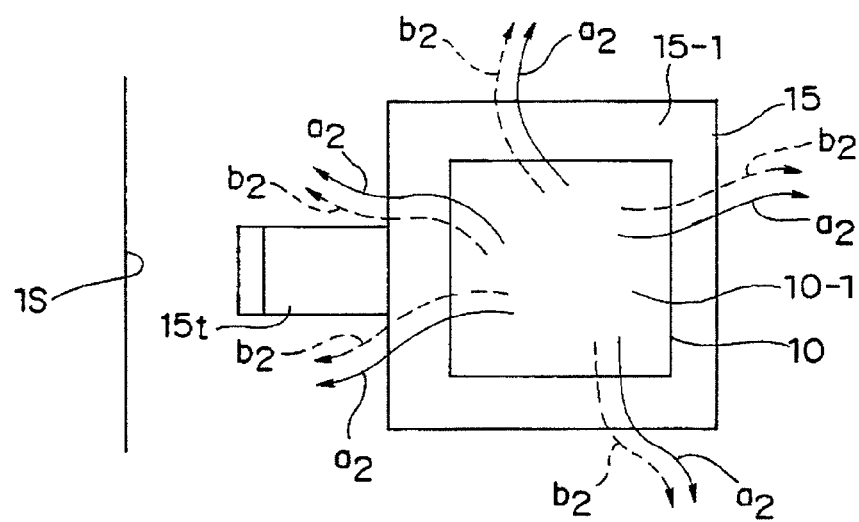
FIG. 22 is a schematic perspective plan view that explains the structure in which, in the clean room relating to the second modified example of FIG. 21, the dust-exhaust assistant member is placed by using the supporting member interposed therebetween.

Moreover, as a second modified example of the above-mentioned embodiment, still another structure may be proposed in which, as shown in FIGS. 21 and 22, a supporting member 15t of the dust-exhaust assistant member 15 is once extended upward from a floor 7 to stand from the floor 7, and then bent laterally so that the dust-exhaust assistant member 15 is supported by the end portion of the supporting member 15t so as to allow the dust-exhaust acceleration face 15-1 of the dust-exhaust assistant member 15 to face the top face 10-1 of the heat radiating member 10 with a distance D in between.

Figure 23:
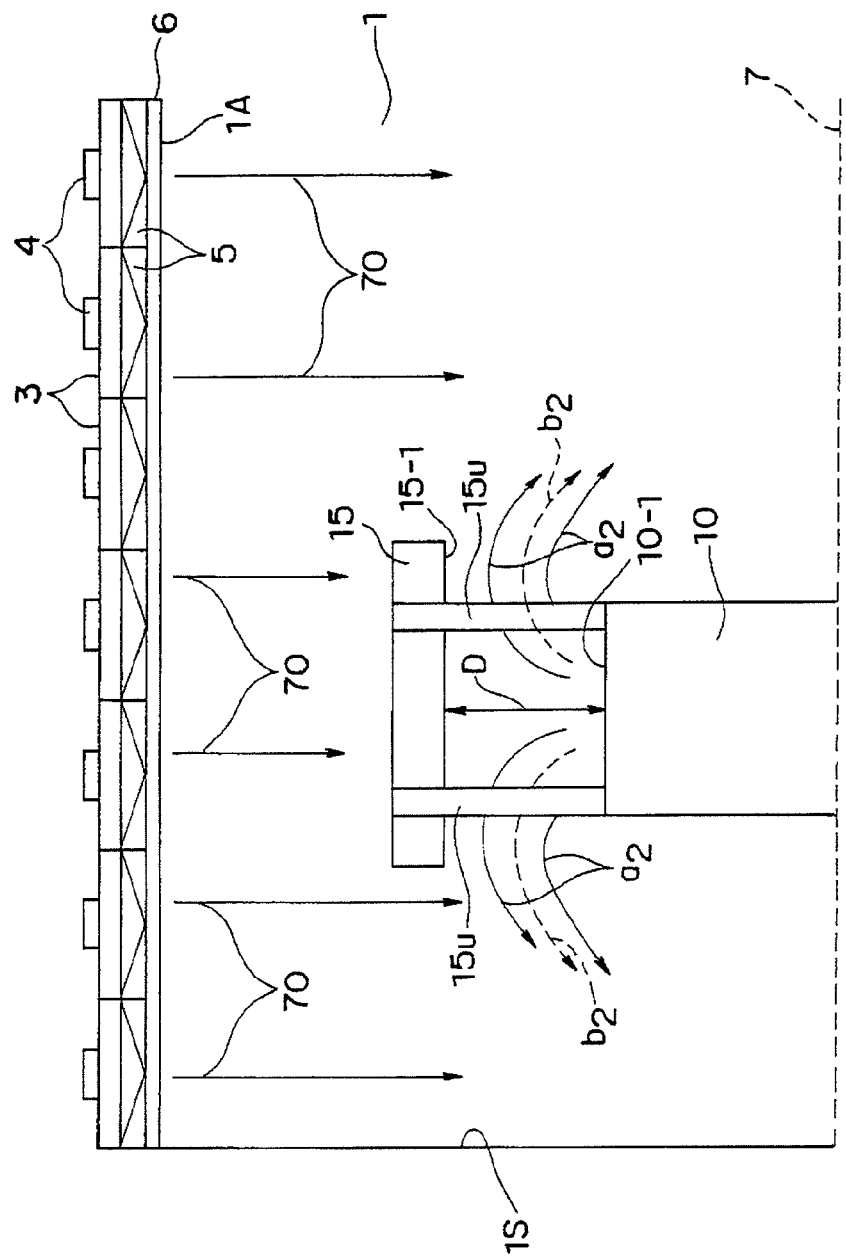
FIG. 23 is an explanatory view that explains a structure in which, in the clean room relating to the third modified example of the first embodiment of the present invention, the dust-exhaust assistant member is placed by using a supporting member interposed therebetween, the supporting member being extended not from a ceiling face, but from a device (heat radiating member) itself that utilizes the dust-exhaust assistant member.
Figure 24:
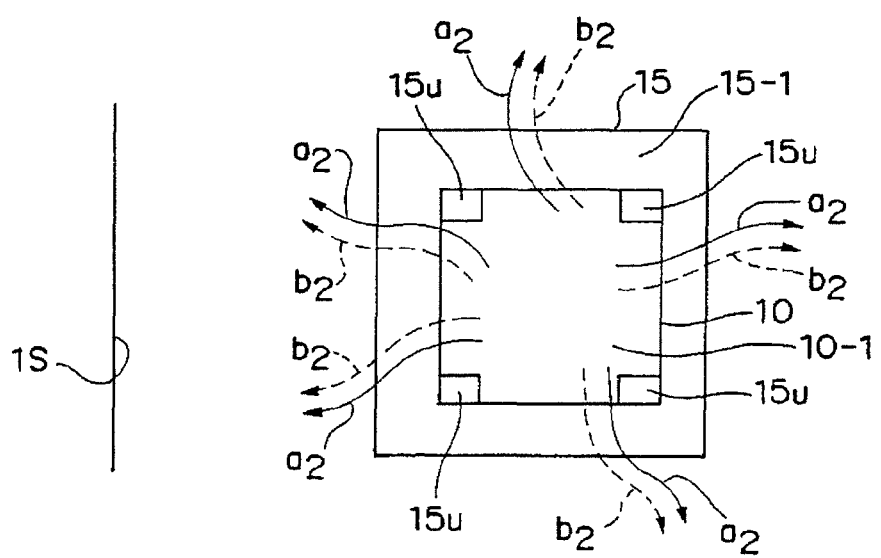
FIG. 24 is a schematic perspective plan view that explains the structure in which, in the clean room relating to the third modified example of FIG. 23, the dust-exhaust assistant member is placed.

Furthermore, as a third modified example of the above-mentioned embodiment, still another structure may be proposed in which, as shown in FIGS. 23 and 24, one or a plurality of supporting members 15u of the dust-exhaust assistant member 15 (for example, four in FIG. 24) are extended upward from the device (heat radiating member) 10 itself that utilizes the dust-exhaust assistant member 15 so that the dust-exhaust assistant member 15 is supported by the end portion of the supporting member 15t so as to allow the dust-exhaust acceleration face 15-1 of the dust-exhaust assistant member 15 to face the top face 10-1 of the heat radiating member 10 with a distance D in between.

Figure 25:
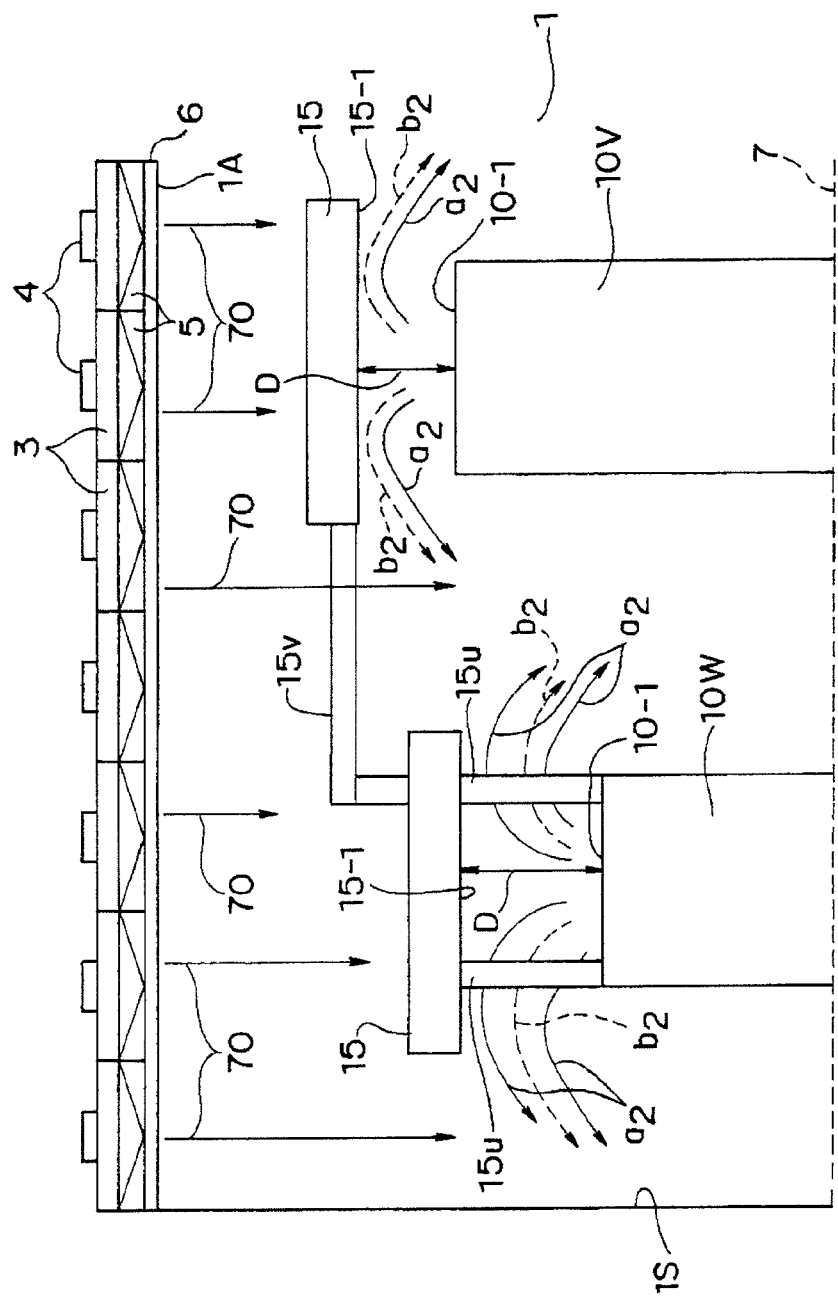
FIG. 25 is an explanatory view that explains a structure in which, in the clean room relating to the fourth modified example of the first embodiment of the present invention, the dust-exhaust assistant member is protruded by using a supporting member interposed therebetween, the supporting member being extended not from a ceiling face, but from a device that is different from the device (heat radiating member) that utilizes the dust-exhaust assistant member, and is disposed adjacent thereto.
Figure 26:
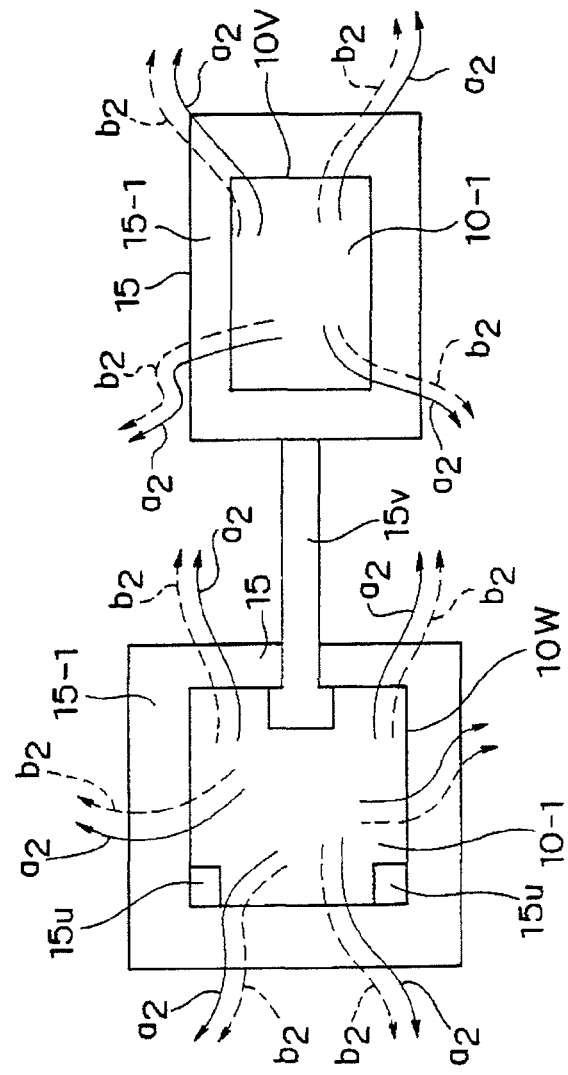
FIG. 26 is a schematic perspective plan view that explains the structure in which, in the clean room relating to the fourth modified example of FIG. 25, the dust-exhaust assistant member is placed by using the supporting member interposed therebetween.

As a fourth modified example of the above-mentioned embodiment, still another structure may be proposed in which, as shown in FIGS. 25 and 26, a supporting member 15v of the dust-exhaust assistant member 15 is once extended upward from a device 10W that is different from a device 10V (heat radiating member) that utilizes the dust-exhaust assistant member 15 and placed adjacent thereto, and then protrude laterally above the device 10V that utilizes the dust-exhaust assistant member 15 so that the dust-exhaust assistant member 15 is supported by the end portion of the supporting member 15v so as to allow the dust-exhaust acceleration face 15-1 of the dust-exhaust assistant member 15 to face the top face 10-1 of the heat radiating member 10V with a distance D in between. Here, in FIG. 26, the supporting member 15v is indicated as a member that can be compatibly used as the supporting member of the dust-exhaust assistant member 15 of the device 10W placed adjacent to the heat radiating member 10V.

Figure 27:
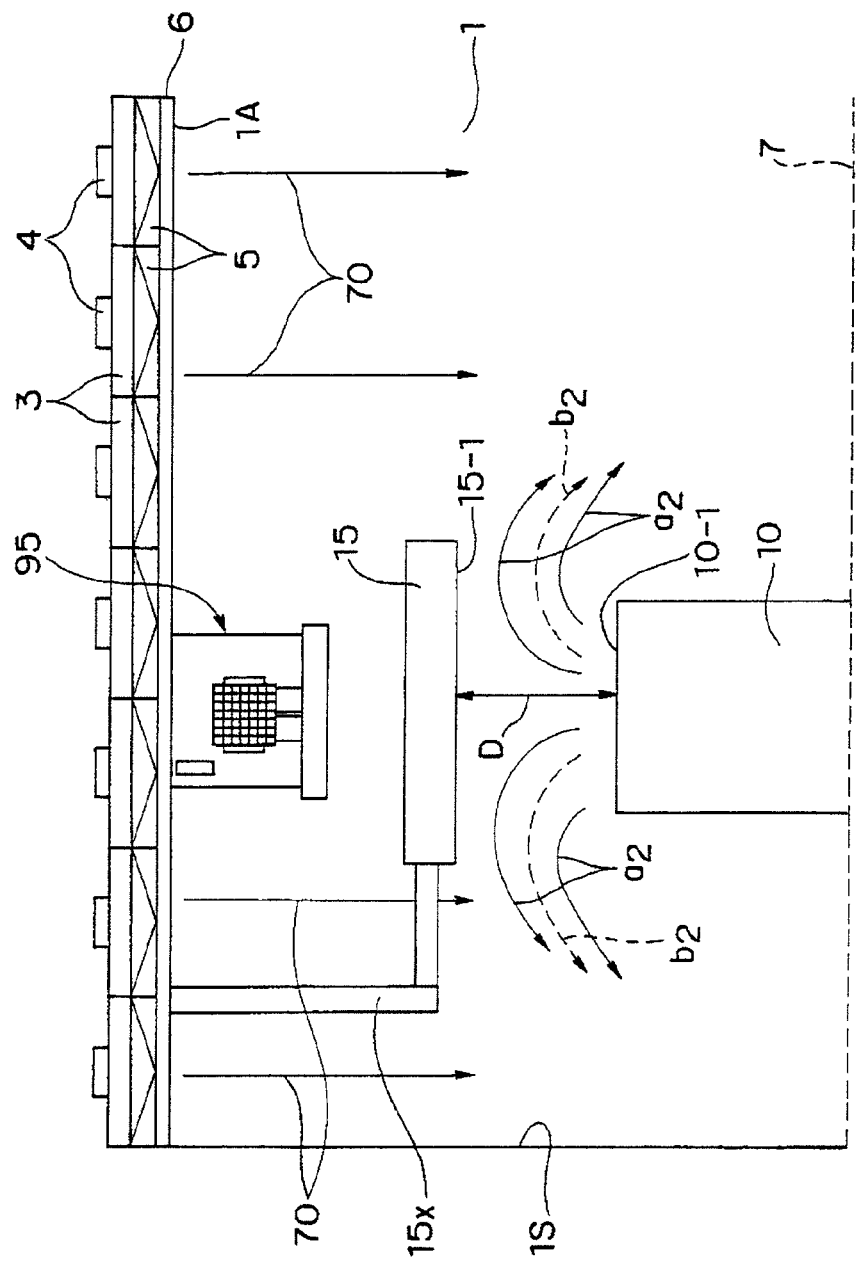
FIG. 27 is an explanatory view that shows a structure in which, in the clean room relating to the fifth modified example of the first embodiment of the present invention, the dust-exhaust assistant member is allowed to protrude from a ceiling face with an L-letter shaped supporting member interposed therebetween.
Figure 28:
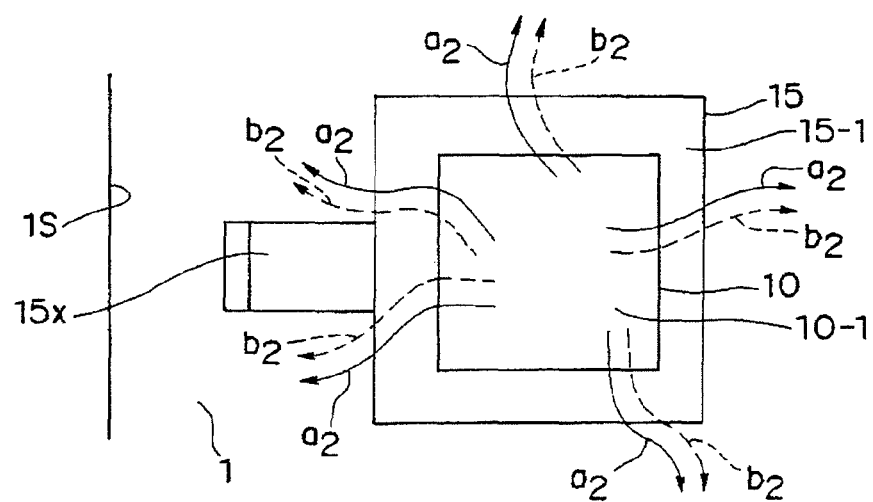
FIG. 28 is a schematic perspective plan view that explains the structure in which, in the clean room relating to the fifth modified example of FIG. 27, the dust-exhaust assistant member is placed by using the supporting member interposed therebetween.
Figure 29:
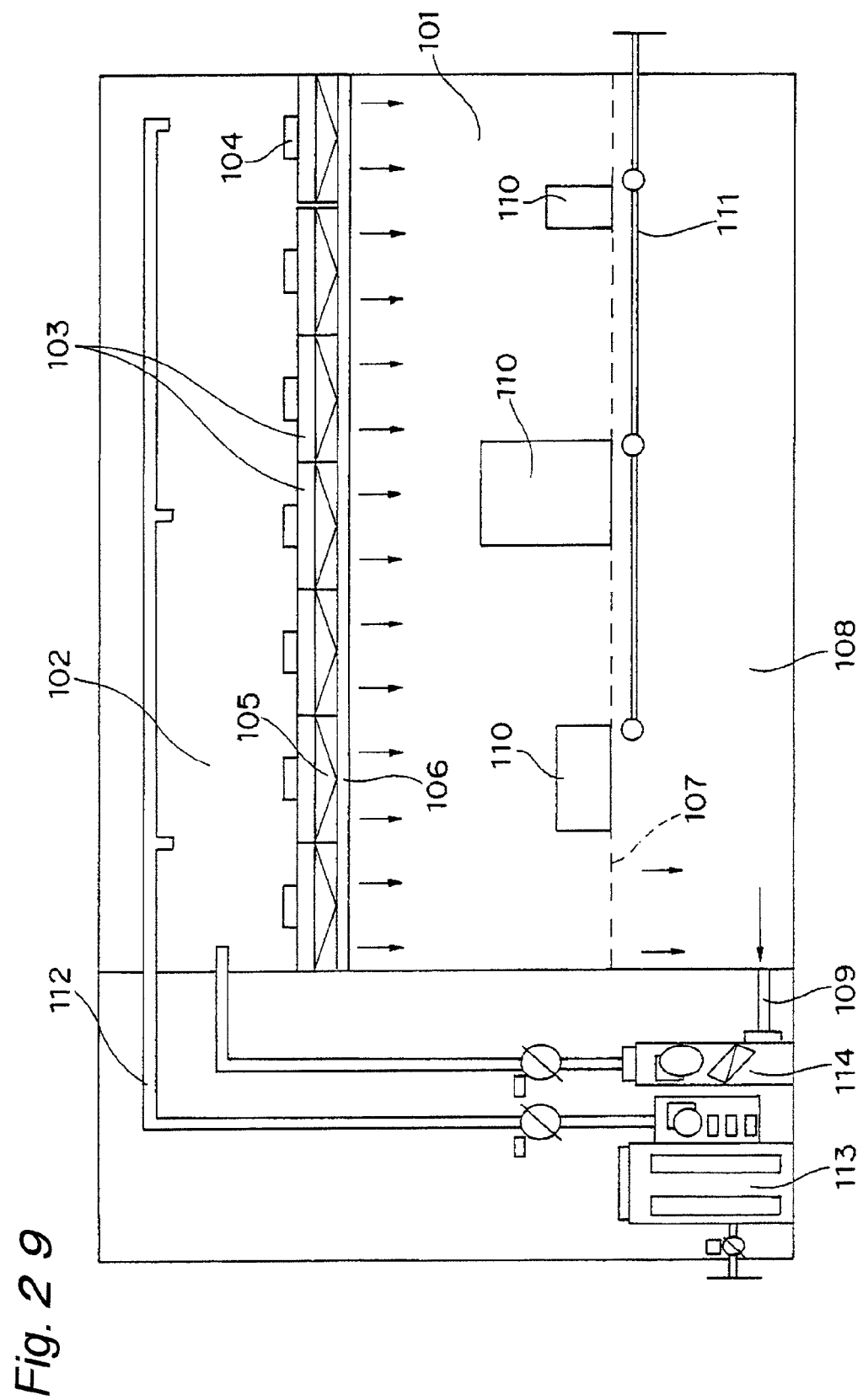
FIG. 29 is an explanatory view that shows a conventional clean room.
Figure 30:
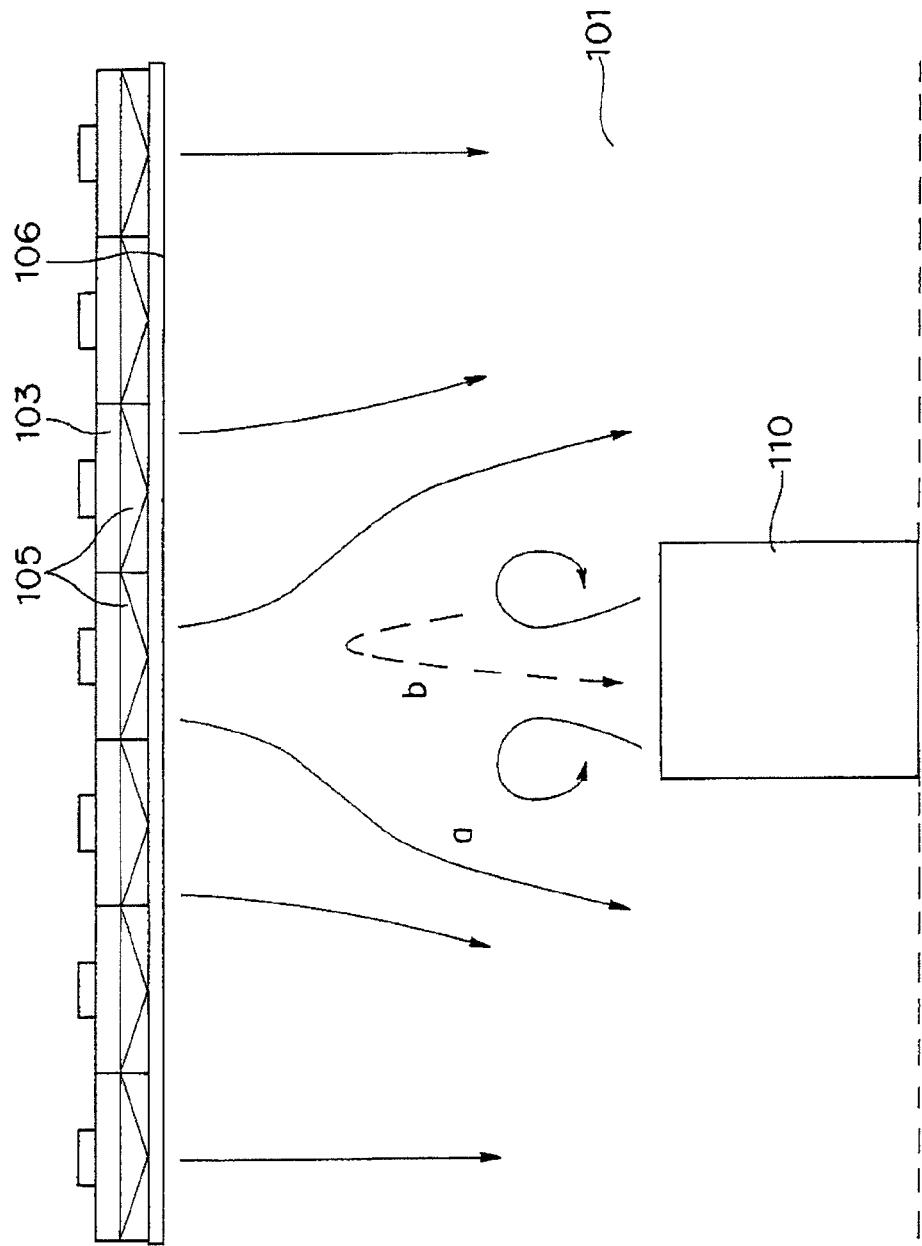
FIG. 30 is a schematic view that shows disturbances of an air flow due to an ascending air flow from the heat radiating member.

Moreover, as a fifth modified example of the above-mentioned embodiment, still another structure may be proposed in which, as shown in FIGS. 27 and 28, a supporting member 15x of the dust-exhaust assistant member is extended downward not straightly from the ceiling face 1A, but in a bent state into an L-letter shape to avoid being made in contact with a device (for example, transporting device 95) placed on the ceiling face 1A, so that the dust-exhaust assistant member 15 is supported thereon so as to allow the dust-exhaust acceleration face 15-1 of the dust-exhaust assistant member 15 to face the top face 10-1 of the heat radiating member 10V with a distance D in between.

The above-mentioned first to fifth modified examples are used in a case where, for example, a transporting device (for example, clean way made by Daifuku Co., Ltd.) 95 is disposed on the ceiling face 1A facing the heat radiating member 10 as shown in FIG. 19, or in a case where, although not specifically shown in drawings, an air supply/discharge duct is connected from the ceiling face 1A toward the heat radiating member 10, and in these cases, since the dust-exhaust assistant member 15 is not directly placed on the ceiling face 1A facing the heat radiating member 10, those structures are effectively adopted. In other words, in these cases, by adopting any one of the first to fifth modified examples, the dust-exhaust acceleration face 15-1 of the dust-exhaust assistant member can be placed to face the top face 10-1 of the heat radiating member 10 with a distance D in between, irrespective of the circumstance of the opposing ceiling face 1A.

By properly combining the arbitrary embodiments of the aforementioned various embodiments, the effects possessed by the embodiments can be produced.

The present invention makes it possible to suppress pollutants from adhering onto a semiconductor wafer in a semiconductor manufacturing factory, and consequently to improve the quality of the semiconductor wafer and the productivity thereof.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A clean room comprising:
   first and second heating radiating members placed on a floor; and
   first and second dust-exhaust assistant members that have first and second dust-exhaust acceleration faces for facing top faces of the first and second heat radiating members, respectively, and that allow the first and second dust-exhaust acceleration faces to be positioned such that first and second distances are defined between the first and second dust-exhaust acceleration faces and the top faces of the first and second heat radiating members, respectively, so that ascending air flows rising from the top faces of the first and second heat radiating members caused by heat generation of the first and second heat radiating members are discharged outward from gaps between the first and second dust-exhaust acceleration faces and the top faces of the first and second heat radiating members, respectively, by the first and second dust-exhaust acceleration faces;
   wherein the second heat radiating member has higher temperature than the first heat radiating member, with a temperature difference between a surface temperature of a top face of the first heat radiating member and a temperature of a peripheral atmosphere of the first heat radiating member being larger than a temperature difference between a surface temperature of a top face of the second heat radiating member and a temperature of a peripheral atmosphere of the second heat radiating member;
   wherein the first dust-exhaust assistant member has the first dust-exhaust acceleration face facing the top face of the first heat radiating member, and is disposed so as to protrude downward from a ceiling facing the clean room, and the second dust-exhaust assistant member has the second dust-exhaust acceleration face facing the top face of the second heat radiating member, and is disposed so as to protrude downward from the ceiling facing the clean room; and
   wherein the first distance between the top face of the first heat radiating member and the first dust-exhaust acceleration face of the first dust-exhaust assistant member is made larger than the second distance between the top face of the second heat radiating member and the second dust-exhaust acceleration face of the second dust-exhaust assistant member.

2. The clean room according to claim 1, wherein each of the first and second the dust-exhaust assistant members is made of a box.

3. The clean room according to claim 1, wherein each of first and second dust-exhaust assistant members is made of an air packing.

4. The clean room according to claim 1, further comprising:
   a supporting member for supporting one of the first and second dust-exhaust assistant members, wherein the supporting member laterally extends above a respective one of the first and second heat radiating members from a side wall that is orthogonal to the floor so as to support said one of the first and second dust-exhaust assistant members.

5. The clean room according to claim 1, further comprising:
a supporting member for supporting one of the first and second dust-exhaust assistant members,
wherein the supporting member extends upward from the floor to support said one of the first and second dust-exhaust assistant members.

6. The clean room according to claim 1, further comprising:
a supporting member for supporting one of the first and second dust-exhaust assistant members,
wherein the supporting member extends upward from a respective one of the first and second heat radiating members to support said one of the first and second dust-exhaust assistant members.

7. The clean room according to claim 1, further comprising:
a supporting member for supporting one of the first and second dust-exhaust assistant members,
wherein the supporting member extends above a respective one of the first and second heat radiating members from a device adjacent to said one of the first and second heat radiating members to support said one of the first and second dust-exhaust assistant members.

8. The clean room according to claim 1, further comprising:
a supporting member for supporting one of the first and second dust-exhaust assistant members,
wherein the supporting member supports said one of the first and second dust-exhaust assistant members from a ceiling that faces the floor.

9. The clean room according to claim 1, wherein each of the first and second dust-exhaust acceleration faces has an anti-static layer.

10. The clean room according to claim 1, wherein each of the first and second dust-exhaust acceleration faces is grounded.

11. The clean room according to claim 1, wherein the first and second dust-exhaust acceleration faces are disposed so as to cover virtually the entire top faces of the first and second heat radiating members, respectively.

12. A clean room comprising:
a dust-exhaust assistant member that has a dust-exhaust acceleration face for facing a top face of a heat radiating member placed on a floor and that allows the dust-exhaust acceleration face to be positioned such that at a distance is defined between the dust-exhaust acceleration face and the top face of the heat radiating member so that an ascending air flow rising from the top face of the heat radiating member cause by heat generation of the heat radiating member is discharged outward from a gap between the dust-exhaust acceleration face and the top face of the heat radiating member by the dust-exhaust acceleration face;

wherein the dust-exhaust assistant member is made of an air packing that is disposed so as to allow the dust-exhaust assistant member to shift upward and downward relative to the ceiling by an ascending air flow from the heat radiating member.

13. The clean room according to claim 12, wherein the dust-exhaust acceleration face of the dust-exhaust assistant member is disposed so as to cover virtually the entire top face of the heat radiating member.

14. The clean room according to claim 12, further comprising:
a supporting member for supporting the dust-exhaust assistant member,
wherein the supporting member laterally extends above the heat radiating member from a side wall that is orthogonal to the floor so as to support the dust-exhaust assistant member.

15. The clean room according to claim 12, further comprising:
a supporting member for supporting the dust-exhaust assistant member,
wherein the supporting member extends upward from the floor to support the dust-exhaust assistant member.

16. The clean room according to claim 12, further comprising:
a supporting member for supporting the dust-exhaust assistant member,
wherein the supporting member extends upward from the heat radiating member to support the dust-exhaust assistant member.

17. The clean room according to claim 12, further comprising:
a supporting member for supporting the dust-exhaust assistant member,
wherein the supporting member extends above the heat radiating member from a device adjacent to the heat radiating member to support the dust-exhaust assistant member.

18. The clean room according to claim 12, further comprising:
a supporting member for supporting the dust-exhaust assistant member,
wherein the supporting member supports the dust-exhaust assistant member from a ceiling that faces the floor.

19. The clean room according to claim 12, wherein a value K (° C./mm), obtained by dividing a temperature difference between a surface temperature of the top face of the heat radiating member and a temperature of a peripheral atmosphere by a distance between the top face of the heat radiating member and the dust-exhaust acceleration face of the dust-exhaust assistant member, is allowed to maintain a relationship $0.032 \leq K \leq 0.065$.

20. The clean room according to claim 12, wherein the dust-exhaust acceleration face of the dust-exhaust assistant member has an anti-static layer.

21. The clean room according to claim 12, wherein the dust-exhaust acceleration face of the dust-exhaust assistant member is grounded.

* * * * *